US012593610B2

(12) United States Patent　　　(10) Patent No.: US 12,593,610 B2

Ghoshal et al.　　　(45) Date of Patent: Mar. 31, 2026

(54) THERMOELECTRIC DEVICES ON CERAMIC

(71) Applicant: Sheetak, Inc., Austin, TX (US)

(72) Inventors: Uttam Ghoshal, Austin, TX (US); Key Kolle, Luling, TX (US)

(73) Assignee: Sheetak, Inc., Austin, TX (US)

( * ) Notice: Subject to any disclaimer, the term of this patent is extended or adjusted under 35 U.S.C. 154(b) by 155 days.

(21) Appl. No.: 18/196,093

(22) Filed: May 11, 2023

(65) Prior Publication Data

US 2023/0371380 A1　　Nov. 16, 2023

Related U.S. Application Data

(60) Provisional application No. 63/340,920, filed on May 11, 2022.

(51) Int. Cl.
H10N 10/817　　(2023.01)
H10N 10/01　　(2023.01)
H10N 10/17　　(2023.01)

(52) U.S. Cl.
CPC ........... H10N 10/817 (2023.02); H10N 10/01 (2023.02); H10N 10/17 (2023.02)

(58) Field of Classification Search
CPC ....... H10N 10/817; H10N 10/17; H10N 10/01
See application file for complete search history.

(56) References Cited

U.S. PATENT DOCUMENTS

| | | |
|---|---|---|
| 1,120,781 A | 12/1914 | Altenkirch |
| 3,296,034 A | 1/1967 | Reich |
| 3,480,846 A | 11/1969 | Mathes |
| 3,735,806 A | 5/1973 | Kirkpatrick |
| 3,826,957 A | 7/1974 | Mc |
| 4,271,681 A | 6/1981 | Schertz |
| 4,288,854 A | 9/1981 | Burroughs |
| 4,322,737 A | 3/1982 | Sliwa |
| 4,448,028 A | 5/1984 | Chao |

(Continued)

FOREIGN PATENT DOCUMENTS

| | | |
|---|---|---|
| CN | 1154467 A | 7/1997 |
| CN | 1259648 A | 7/2000 |

(Continued)

OTHER PUBLICATIONS

B.J. O'Brien, C. S. Wallace, and K. Landecker, "Cascading of Peltier Couples for Thermoelectric Cooling*", Journal of Applied Physics, vol. 27, No. 7, Jul. 1956, (4 pages).

(Continued)

*Primary Examiner* — Uyen M Tran

(74) *Attorney, Agent, or Firm* — Clark Hill PLC

(57)　　　ABSTRACT

The disclosure is related to structures and method of making thermoelectric devices. The structures include an electrically nonconductive and thermally conductive substrate with direct bonded or electroplated copper. Thermoelement pairs are formed on a barrier layer deposited on the outer layers of the substrate in gaps formed from insulator material deposited on the barrier layer. Openings in the barrier layer may be filled with an insulator to isolate thermoelements, which may then be bridged by a metal layer. Thermoelement pairs may be combined to form larger devices.

11 Claims, 24 Drawing Sheets

(56) References Cited

U.S. PATENT DOCUMENTS

| | | | |
|---|---|---|---|
| 4,687,879 A * | 8/1987 | Hendricks | H10N 10/17 |
| | | | 136/212 |
| 4,698,541 A | 10/1987 | Bar-Cohen | |
| 5,367,879 A | 11/1994 | Doke | |
| 5,387,849 A | 2/1995 | Sridharan | |
| 5,501,076 A | 3/1996 | Sharp | |
| 5,579,830 A | 12/1996 | Giammaruti | |
| 5,711,155 A | 1/1998 | Devilbiss | |
| 5,737,923 A | 4/1998 | Gilley | |
| 5,782,094 A | 7/1998 | Freeman | |
| 5,959,341 A | 9/1999 | Tsuno | |
| 6,003,319 A | 12/1999 | Gilley | |
| 6,084,772 A | 7/2000 | Pell | |
| 6,329,721 B1 | 12/2001 | Digiacomo | |
| 6,338,251 B1 | 1/2002 | Ghoshal | |
| 6,370,884 B1 | 4/2002 | Kelada | |
| 6,583,350 B1 | 6/2003 | Gee | |
| 6,740,600 B2 | 5/2004 | Ghoshal | |
| 7,032,389 B2 | 4/2006 | Cauchy | |
| 7,131,286 B2 | 11/2006 | Ghoshal | |
| 7,342,169 B2 | 3/2008 | Venkatasubramania | |
| 7,448,222 B2 | 11/2008 | Bormann | |
| 10,032,975 B2 | 7/2018 | Ghoshal | |
| 11,462,669 B2 | 10/2022 | Ghoshal | |
| 2003/0029174 A1 | 2/2003 | Lee | |
| 2003/0041892 A1 | 3/2003 | Fleurial | |
| 2004/0173257 A1 | 9/2004 | Rogers | |
| 2005/0051208 A1 | 3/2005 | Mount | |
| 2005/0126184 A1 | 6/2005 | Cauchy | |
| 2005/0150535 A1 | 7/2005 | Samavedam | |
| 2005/0150536 A1 | 7/2005 | Ngai | |
| 2005/0150537 A1 | 7/2005 | Ghoshal | |
| 2005/0210884 A1 | 9/2005 | Tuskiewicz | |
| 2005/0274120 A1 | 12/2005 | Quisenberry | |
| 2006/0011776 A1 | 1/2006 | Maurer | |
| 2006/0076046 A1 | 4/2006 | Ghoshal | |
| 2006/0117761 A1 | 6/2006 | Bormann | |
| 2006/0137360 A1 | 6/2006 | Ghoshal | |
| 2006/0255341 A1 | 11/2006 | Pinnington | |
| 2007/0090892 A1 | 4/2007 | Larson | |
| 2007/0137687 A1 | 6/2007 | Tanielian | |
| 2007/0221266 A1 | 9/2007 | Davies | |
| 2007/0251569 A1 | 11/2007 | Shan | |
| 2007/0261730 A1 | 11/2007 | Seker | |
| 2007/0289622 A1 | 12/2007 | Hecht | |
| 2008/0020946 A1 | 1/2008 | Venkatasubramania | |
| 2008/0053509 A1 | 3/2008 | Flitsch | |
| 2008/0121263 A1 | 5/2008 | Schutte | |
| 2008/0178606 A1 | 7/2008 | Chen | |
| 2008/0184710 A1 | 8/2008 | Devilbiss | |
| 2009/0049845 A1 | 2/2009 | Mcstravick | |
| 2009/0109621 A1 | 4/2009 | Cheng | |
| 2009/0322221 A1 | 12/2009 | Makansi | |
| 2010/0126555 A1 | 5/2010 | Maxton | |
| 2010/0186794 A1 | 7/2010 | Chen | |
| 2011/0000224 A1 | 1/2011 | Ghoshal | |
| 2013/0167896 A1 * | 7/2013 | Fann | H10N 19/101 |
| | | | 228/180.1 |
| 2014/0251403 A1 | 9/2014 | Ghoshal | |
| 2015/0159924 A1 | 6/2015 | Calderon | |
| 2015/0204585 A1 * | 7/2015 | Won | H10N 10/13 |
| | | | 136/203 |
| 2015/0325773 A1 | 11/2015 | Ghoshal | |
| 2016/0178252 A1 | 6/2016 | Nakamura | |
| 2016/0372650 A1 | 12/2016 | Ghoshal | |
| 2018/0337321 A1 | 11/2018 | Ghoshal | |
| 2018/0366629 A1 | 12/2018 | Ghoshal | |
| 2022/0384703 A1 * | 12/2022 | Ghoshal | H10N 10/01 |

FOREIGN PATENT DOCUMENTS

| | | | | | |
|---|---|---|---|---|---|
| CN | 1478307 A | 2/2004 | | | |
| CN | 1680766 A | 10/2005 | | | |
| CN | 1845316 A | 10/2006 | | | |
| JP | 2003343986 A | 12/2003 | | | |
| JP | 2007178043 A | 7/2007 | | | |
| JP | WO2018143185 A1 * | 11/2019 | | | |
| WO | 2002047177 A2 | 6/2002 | | | |
| WO | 2006119305 A2 | 11/2006 | | | |
| WO | 2009111008 A1 | 9/2009 | | | |
| WO | WO-2010065082 A1 * | 6/2010 | | C04B 35/547 | |
| WO | 2011008280 A1 | 1/2011 | | | |
| WO | WO-2013121486 A1 * | 8/2013 | | H01L 35/30 | |

OTHER PUBLICATIONS

"Heat Control Filters" (2001). Newport Corporation.

Written Opinion of the International Search Authority for International Application No. PCT/US2009/001542, dated May 9, 2009 (application's corresponding PCT applicatin) (5 pages).

International Search Report from the International Searching Authority Korea (US) for International Application No. PCT/US10/01981 mailed Sep. 15, 2010, corresponding to U.S. Appl. No. 13/496,291, published as US2012-0192574 Al on Aug. 2, 2012 (2 pages).

Notification of the First Office Action dated Dec. 22, 2011, State Intellectual Property Office of People's Republic of China; Chinese National Phase of PCT Application No. PCT/US2009/001542, with English translation (11 pages).

Notification of First Office Action from the State Intellectual Property Office of P.R.C. mailed Mar. 28, 2012 corresponding to Chinese patent application Serial No. 200980107943.1 (15 pages), with English translation (19 pages); national phase application of PCT No. PCT/US2009/001348.

PCT International Search Report for International Application No. PCT/ US2012/060498 mailed Jan. 2, 2013 (2 pages).

PCT International Search Report for International Application No. PCT/US18/23140 dated May 30, 2018 (2 pages).

PCT Written Opinion of the International Searching Authority for International Application No. PCT/US18/23140 dated May 30, 2018 (23 pages).

PCT International Preliminary Report on Patentability for International Application No. PCT/US18/23140 issued Sep. 17, 2019 (16 pages).

Examination Report for India App. No. 202017034922 dated May 9, 2022.

PCT International Search Report for International Application No. PCT/US22/51351 dated May 3, 2023 (5 pages).

PCT Written Opinion of the International Searching Authority for International Application No. PCT/US22/51351 dated May 3, 2023 (5 pages).

* cited by examiner

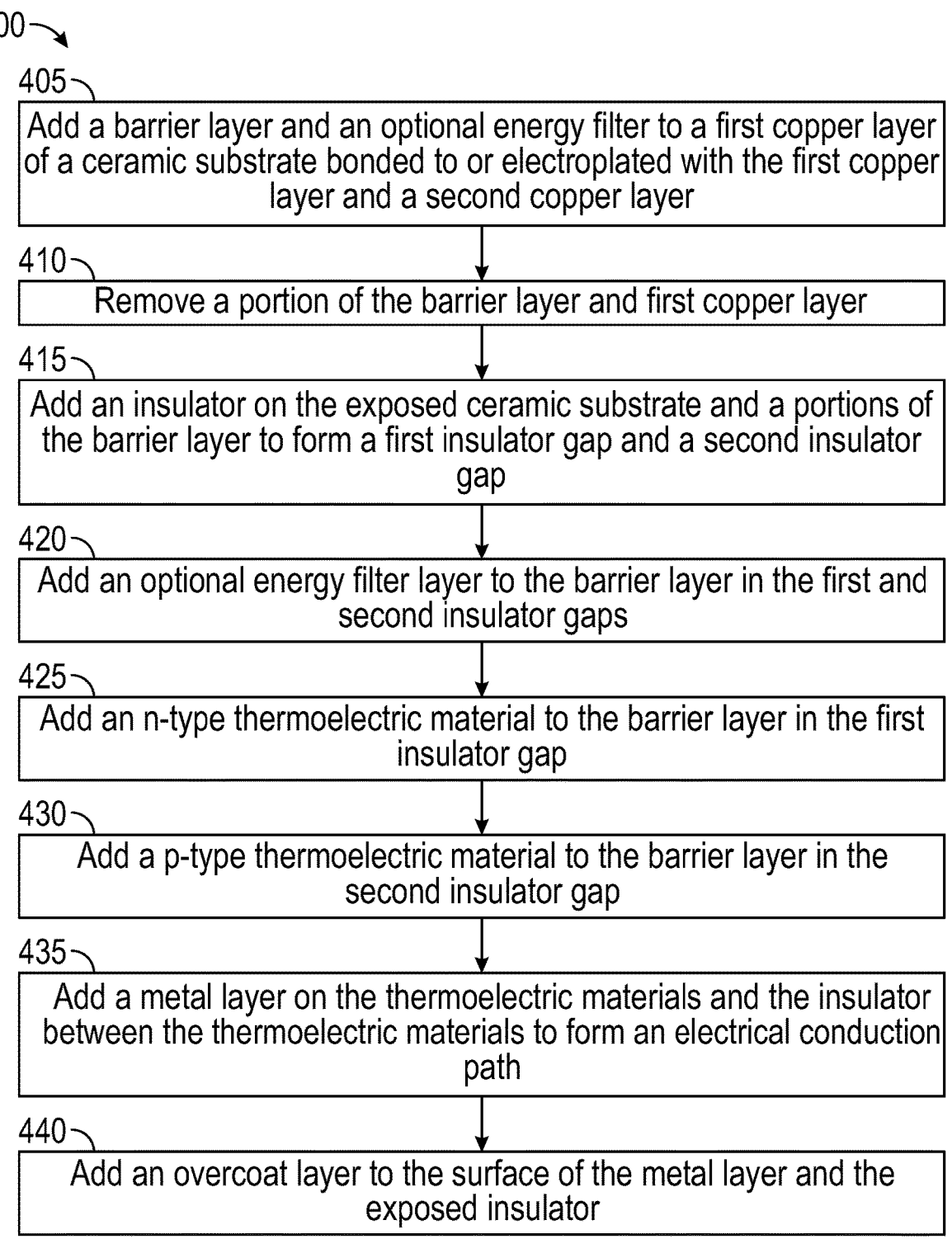

400

405
Add a barrier layer and an optional energy filter to a first copper layer of a ceramic substrate bonded to or electroplated with the first copper layer and a second copper layer 410
Remove a portion of the barrier layer and first copper layer 415
Add an insulator on the exposed ceramic substrate and a portions of the barrier layer to form a first insulator gap and a second insulator gap 420
Add an optional energy filter layer to the barrier layer in the first and second insulator gaps 425
Add an n-type thermoelectric material to the barrier layer in the first insulator gap 430
Add a p-type thermoelectric material to the barrier layer in the second insulator gap 435
Add a metal layer on the thermoelectric materials and the insulator between the thermoelectric materials to form an electrical conduction path 440
Add an overcoat layer to the surface of the metal layer and the exposed insulator

FIG. 4A

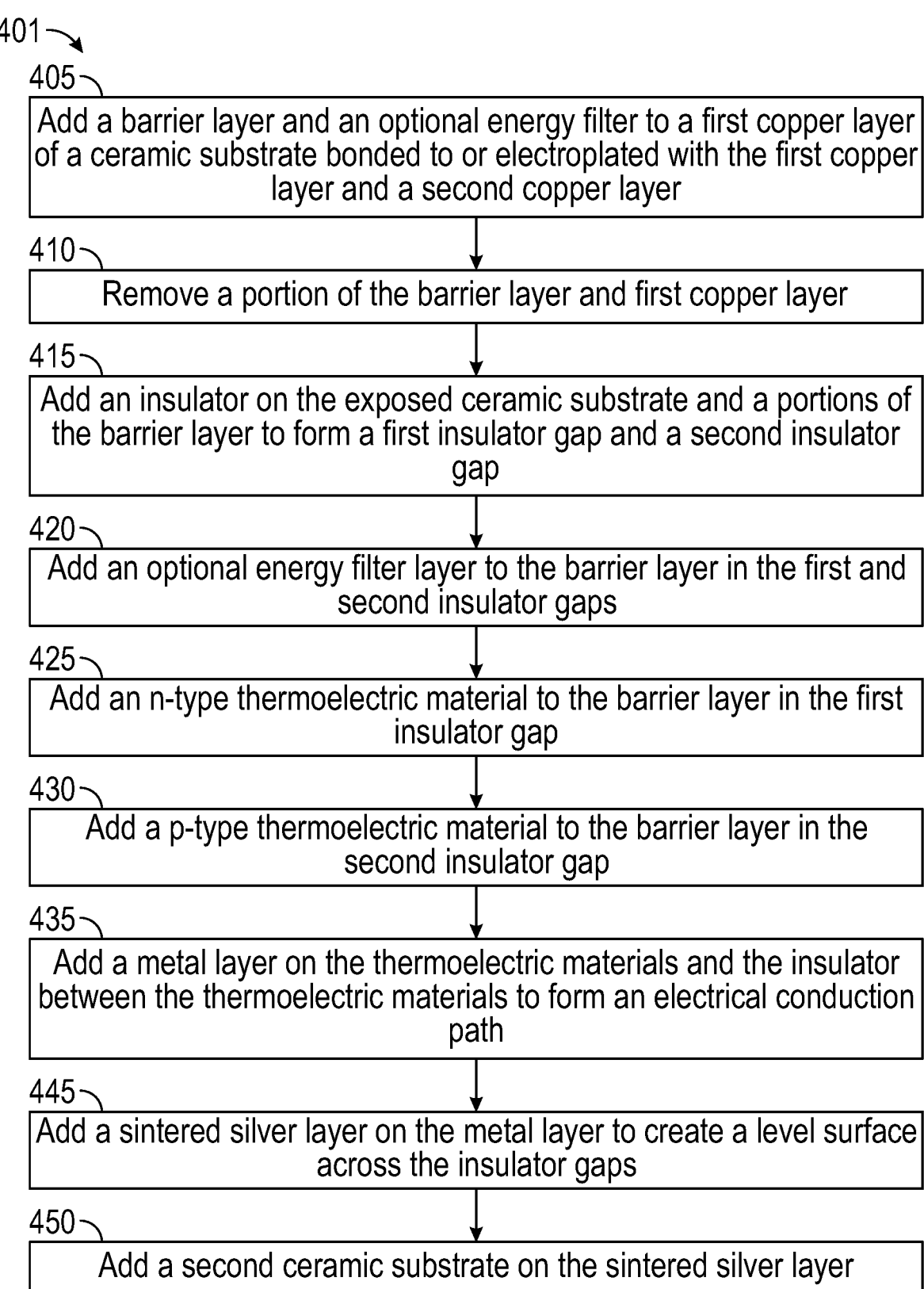

401

405
Add a barrier layer and an optional energy filter to a first copper layer of a ceramic substrate bonded to or electroplated with the first copper layer and a second copper layer 410
Remove a portion of the barrier layer and first copper layer 415
Add an insulator on the exposed ceramic substrate and a portions of the barrier layer to form a first insulator gap and a second insulator gap 420
Add an optional energy filter layer to the barrier layer in the first and second insulator gaps 425
Add an n-type thermoelectric material to the barrier layer in the first insulator gap 430
Add a p-type thermoelectric material to the barrier layer in the second insulator gap 435
Add a metal layer on the thermoelectric materials and the insulator between the thermoelectric materials to form an electrical conduction path 445
Add a sintered silver layer on the metal layer to create a level surface across the insulator gaps 450
Add a second ceramic substrate on the sintered silver layer

FIG. 4B

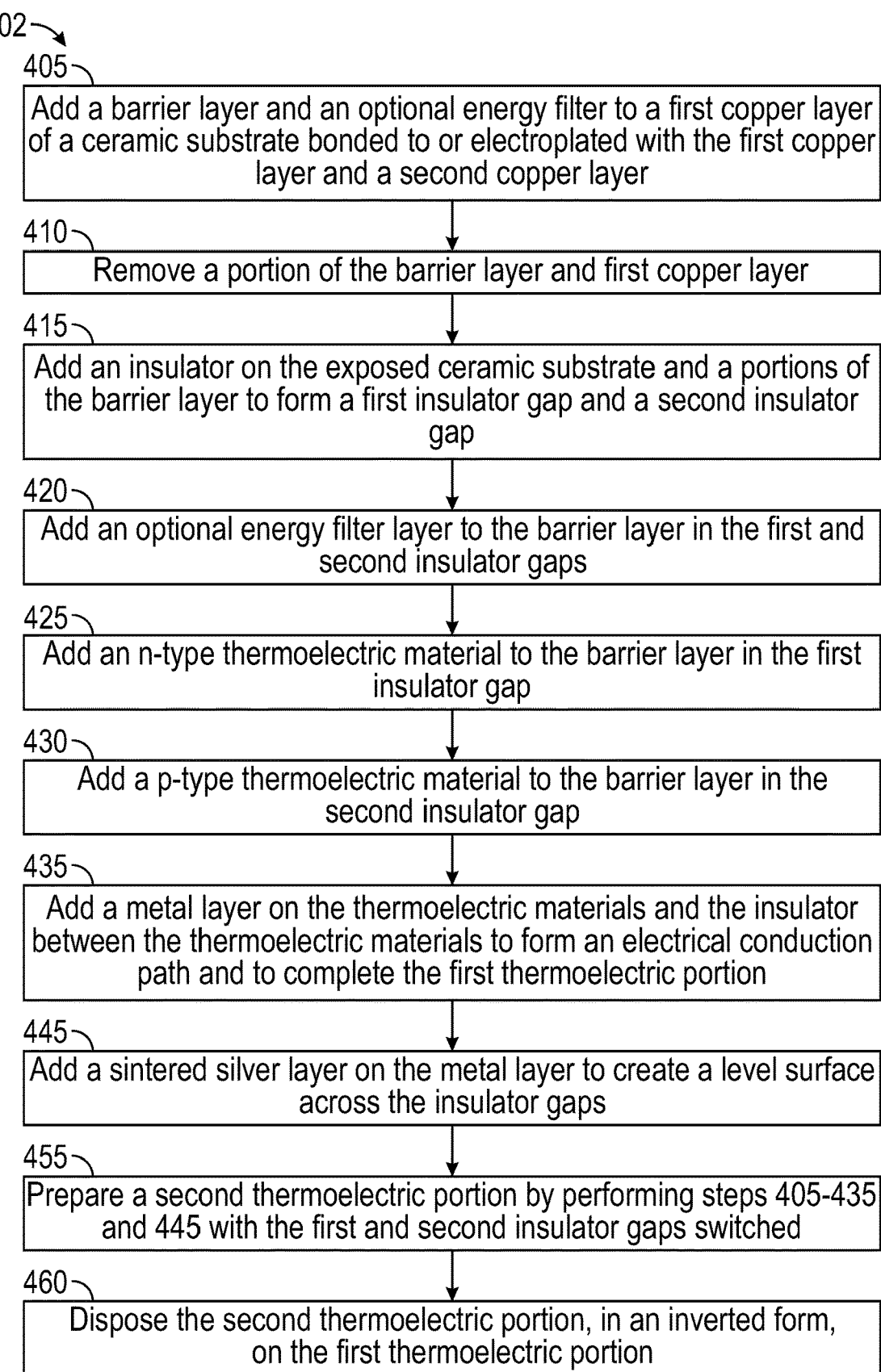

402

405
Add a barrier layer and an optional energy filter to a first copper layer of a ceramic substrate bonded to or electroplated with the first copper layer and a second copper layer 410
Remove a portion of the barrier layer and first copper layer 415
Add an insulator on the exposed ceramic substrate and a portions of the barrier layer to form a first insulator gap and a second insulator gap 420
Add an optional energy filter layer to the barrier layer in the first and second insulator gaps 425
Add an n-type thermoelectric material to the barrier layer in the first insulator gap 430
Add a p-type thermoelectric material to the barrier layer in the second insulator gap 435
Add a metal layer on the thermoelectric materials and the insulator between the thermoelectric materials to form an electrical conduction path and to complete the first thermoelectric portion 445
Add a sintered silver layer on the metal layer to create a level surface across the insulator gaps 455
Prepare a second thermoelectric portion by performing steps 405-435 and 445 with the first and second insulator gaps switched 460
Dispose the second thermoelectric portion, in an inverted form, on the first thermoelectric portion

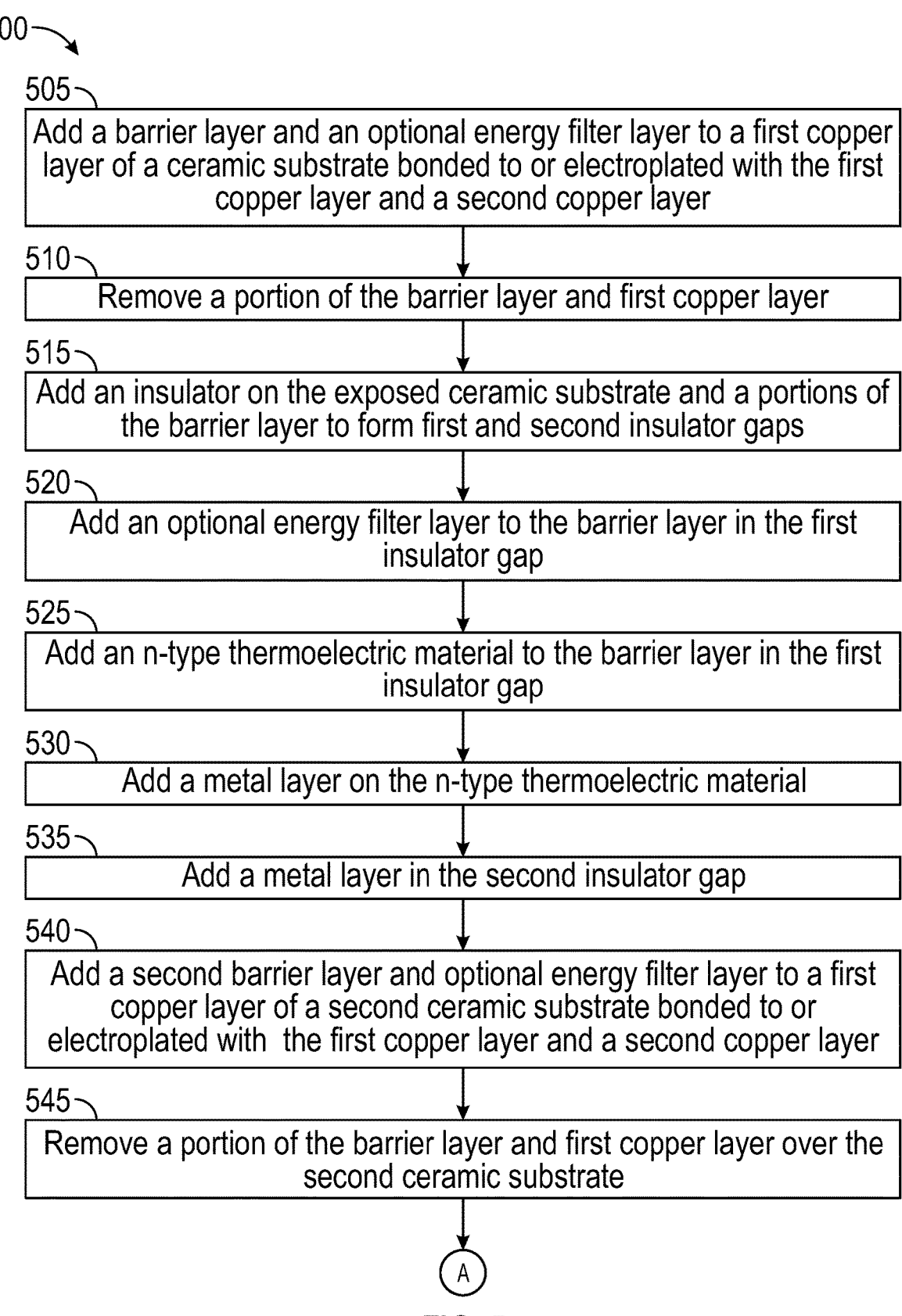

505
Add a barrier layer and an optional energy filter layer to a first copper layer of a ceramic substrate bonded to or electroplated with the first copper layer and a second copper layer 510
Remove a portion of the barrier layer and first copper layer 515
Add an insulator on the exposed ceramic substrate and a portions of the barrier layer to form first and second insulator gaps 520
Add an optional energy filter layer to the barrier layer in the first insulator gap 525
Add an n-type thermoelectric material to the barrier layer in the first insulator gap 530
Add a metal layer on the n-type thermoelectric material 535
Add a metal layer in the second insulator gap 540
Add a second barrier layer and optional energy filter layer to a first copper layer of a second ceramic substrate bonded to or electroplated with the first copper layer and a second copper layer 545
Remove a portion of the barrier layer and first copper layer over the second ceramic substrate

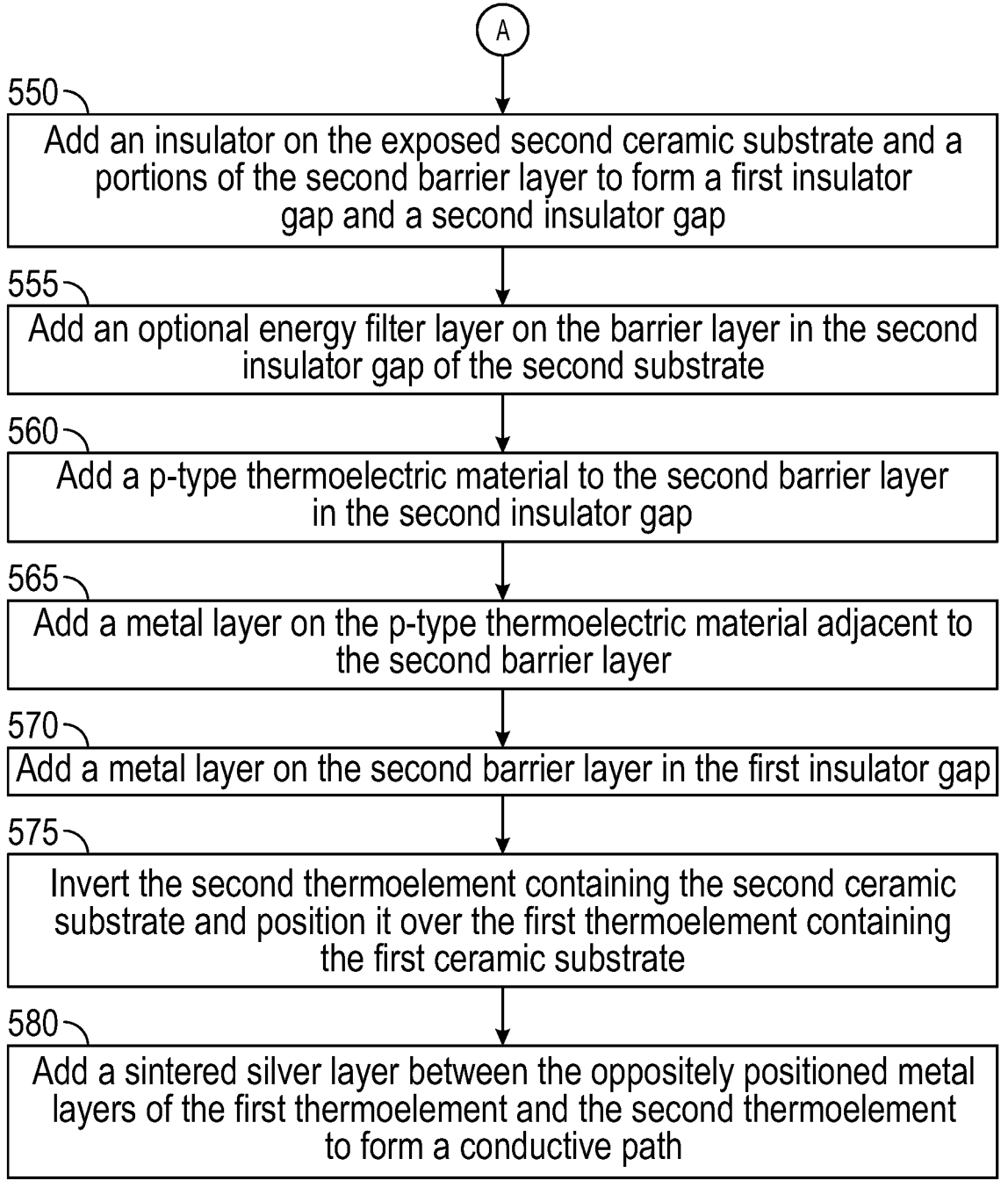

Ⓐ

550 — Add an insulator on the exposed second ceramic substrate and a portions of the second barrier layer to form a first insulator gap and a second insulator gap 555 — Add an optional energy filter layer on the barrier layer in the second insulator gap of the second substrate 560 — Add a p-type thermoelectric material to the second barrier layer in the second insulator gap 565 — Add a metal layer on the p-type thermoelectric material adjacent to the second barrier layer 570 — Add a metal layer on the second barrier layer in the first insulator gap 575 — Invert the second thermoelement containing the second ceramic substrate and position it over the first thermoelement containing the first ceramic substrate 580 — Add a sintered silver layer between the oppositely positioned metal layers of the first thermoelement and the second thermoelement to form a conductive path

FIG. 5
(Continued)

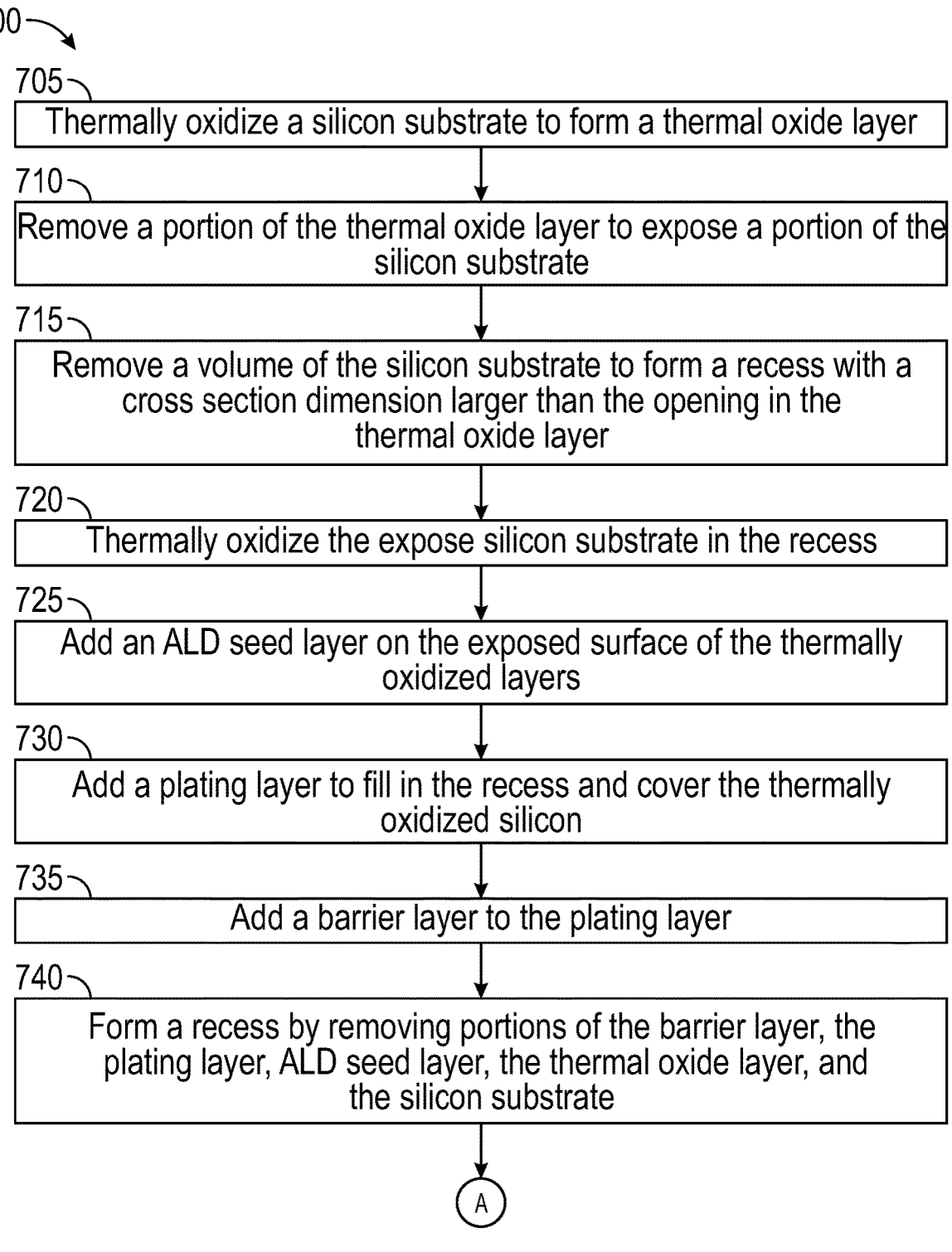

700

705
Thermally oxidize a silicon substrate to form a thermal oxide layer

710
Remove a portion of the thermal oxide layer to expose a portion of the silicon substrate 715
Remove a volume of the silicon substrate to form a recess with a cross section dimension larger than the opening in the thermal oxide layer 720
Thermally oxidize the expose silicon substrate in the recess 725
Add an ALD seed layer on the exposed surface of the thermally oxidized layers 730
Add a plating layer to fill in the recess and cover the thermally oxidized silicon 735
Add a barrier layer to the plating layer 740
Form a recess by removing portions of the barrier layer, the plating layer, ALD seed layer, the thermal oxide layer, and the silicon substrate

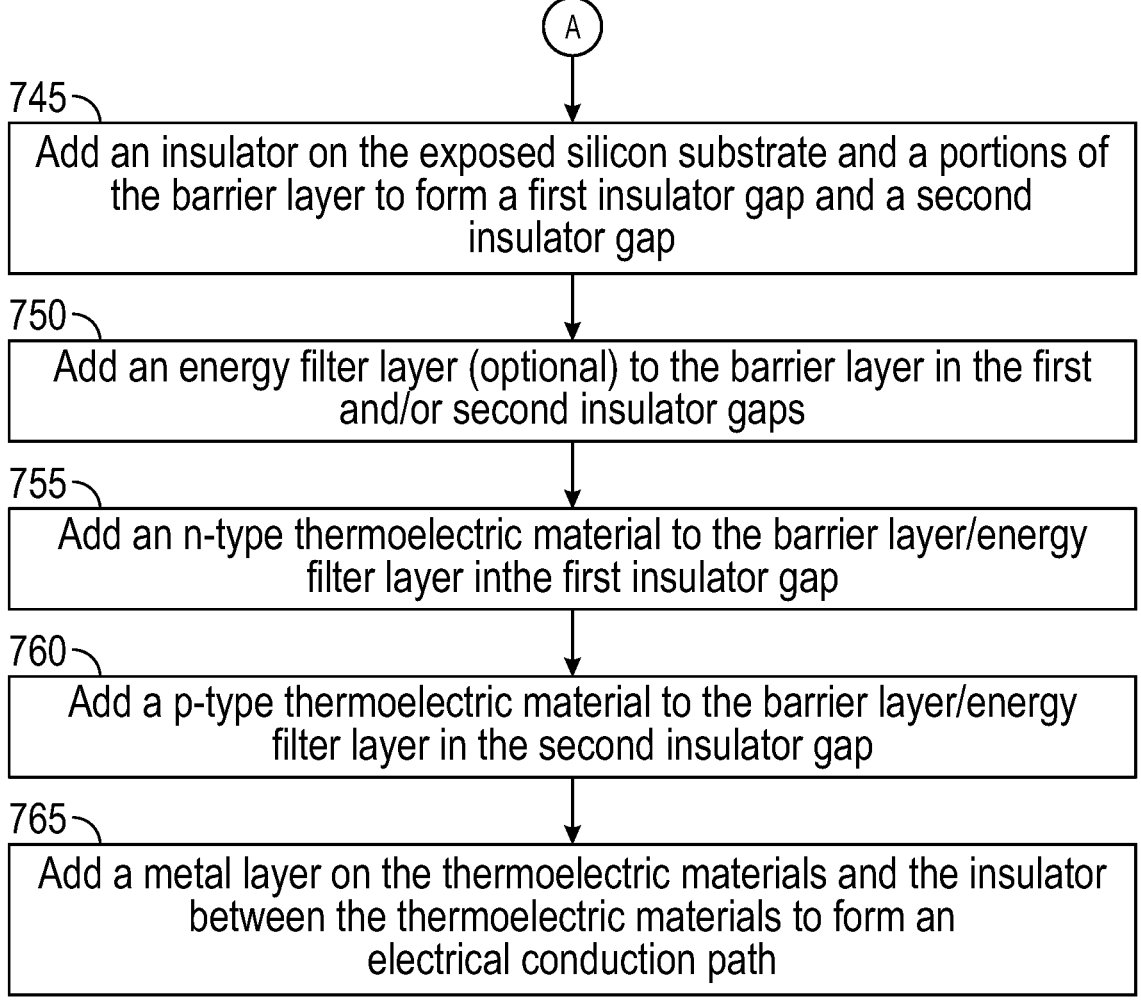

A

745 — Add an insulator on the exposed silicon substrate and a portions of the barrier layer to form a first insulator gap and a second insulator gap 750 — Add an energy filter layer (optional) to the barrier layer in the first and/or second insulator gaps 755 — Add an n-type thermoelectric material to the barrier layer/energy filter layer inthe first insulator gap 760 — Add a p-type thermoelectric material to the barrier layer/energy filter layer in the second insulator gap 765 — Add a metal layer on the thermoelectric materials and the insulator between the thermoelectric materials to form an electrical conduction path FIG. 7
(Continued)

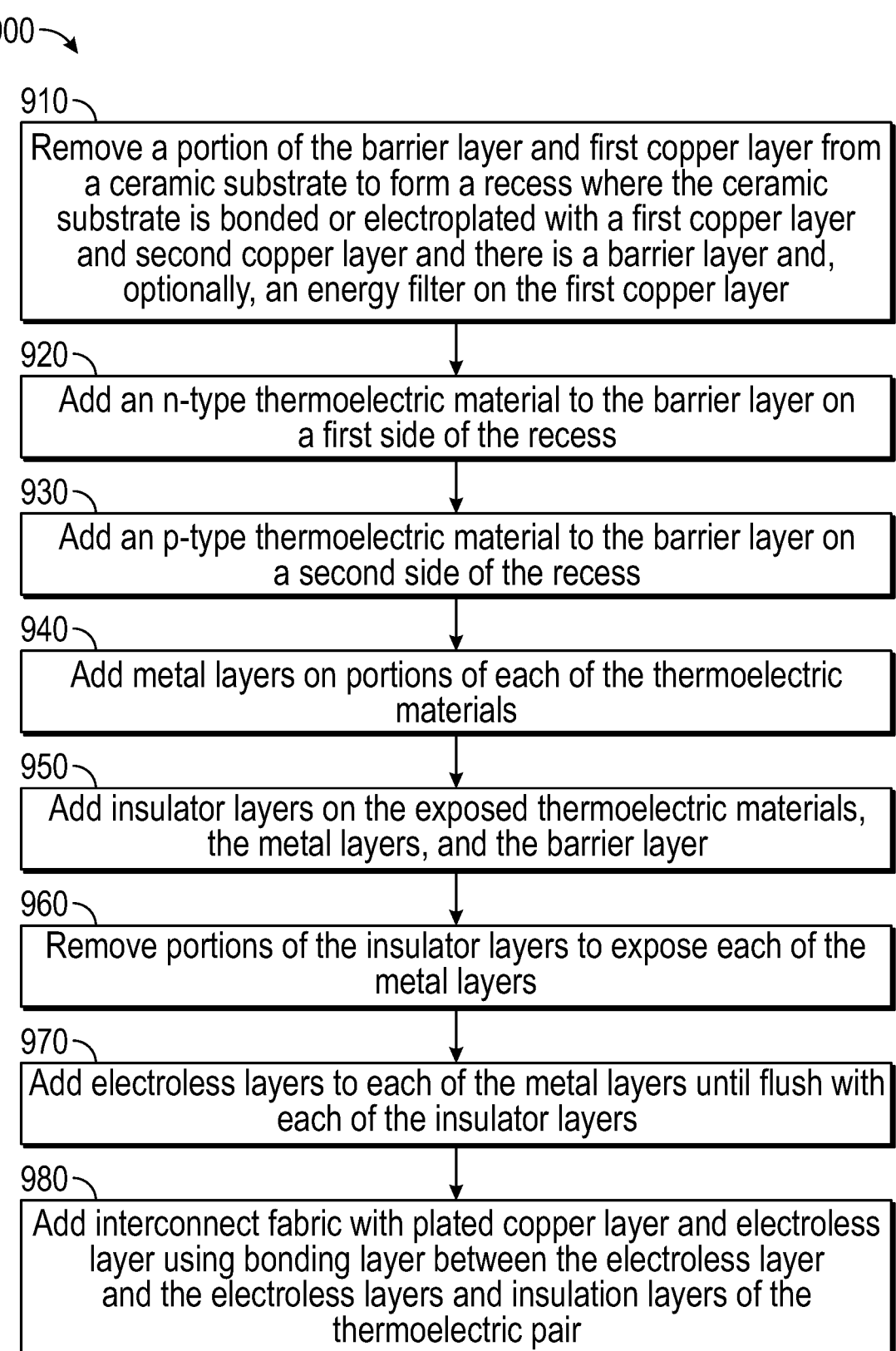

900

910 — Remove a portion of the barrier layer and first copper layer from a ceramic substrate to form a recess where the ceramic substrate is bonded or electroplated with a first copper layer and second copper layer and there is a barrier layer and, optionally, an energy filter on the first copper layer 920 — Add an n-type thermoelectric material to the barrier layer on a first side of the recess 930 — Add an p-type thermoelectric material to the barrier layer on a second side of the recess 940 — Add metal layers on portions of each of the thermoelectric materials 950 — Add insulator layers on the exposed thermoelectric materials, the metal layers, and the barrier layer 960 — Remove portions of the insulator layers to expose each of the metal layers 970 — Add electroless layers to each of the metal layers until flush with each of the insulator layers 980 — Add interconnect fabric with plated copper layer and electroless layer using bonding layer between the electroless layer and the electroless layers and insulation layers of the thermoelectric pair

FIG. 9

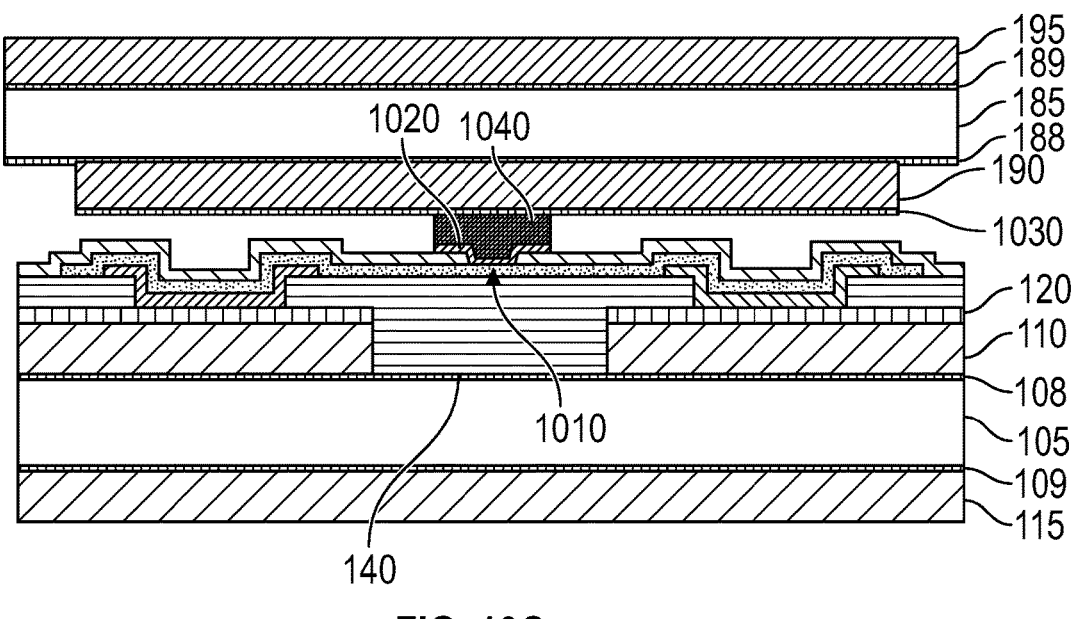

1110 ⌐
Remove a portion of the overcoat layer between the n-type thermoelectric material and the p-type thermoelectric material down to the metal layer 1120 ⌐
Form a metal pad by depositing a metal on the metal layer where the overcoat was removed and adjacent on the overcoat 1130 ⌐
Dispose a solder on a second bonded or electroplated silicon substrate 1140 ⌐
Bond the second bonded or electroplated silicon substrate to the metal pad with the solder

FIG. 11

THERMOELECTRIC DEVICES ON CERAMIC

BACKGROUND OF THE DISCLOSURE

1. Field of the Disclosure

The present disclosure relates to apparatuses and methods for making thermoelectric devices, and, in particular, manufacturing thermoelement pairs on ceramics for heating, cooling, and power generation.

2. Description of the Related Art

Thermoelectric devices have been used since the 1950s to heat, cool, and generate power; however, widespread use has been held back due to poor performance and low efficiency when compared with other available heating, cooling, and power generation technologies. Key factors in understanding the performance of thermoelectric devices include the coefficient of performance (COP), which is the ratio of the thermal output power and the electrical input power of a thermoelectric device, the temperature differential across the hot and cold sides of the thermoelectric device, and the reliability of the thermoelectric device.

A shortcoming in prior art thermoelectric devices is backflow of heat which result in low COP and efficiency. Another shortcoming is low reliability due to heat-related expansion and contraction of the thermoelements and adjacent structures with dissimilar coefficients of thermal expansion, including the need for solder between layers, which can result in failures. Another shortcoming is the interdiffusion of thermoelectric materials, solders, and metals for interconnections. Another shortcoming is the difficulty in assembly and manufacture of thermoelectric devices that increases the cost of the thermoelectric devices.

What are needed are thermoelectric device structures that reduce thermal losses, do not rely on soldered connections, have low-resistance metal interconnections, can operate over large temperature range (−200° C. to 1000° C.), resist diffusion of thermoelements into substrate materials, and increase performance.

BRIEF SUMMARY OF THE DISCLOSURE

In aspects, the present disclosure is related to an apparatus and method for making thermoelectric devices, and, in particular, preparing thermoelements on ceramics for heating, cooling, and power generation.

One embodiment according to the present disclosure includes a thermoelectric apparatus, the apparatus including: a first stage including: a direct bond copper substrate that includes: a first copper layer with an opening; a substrate; and a second copper layer (optional); a barrier layer disposed on the first copper layer with an opening coterminous with the opening in the first copper layer; an insulator disposed on the substrate through the opening in the first copper layer and the opening in the barrier layer and on the barrier layer to form a first insulator gap on one side of the opening in the barrier layer and a second insulator gap on other side of the opening in the barrier layer; an n-type thermoelectric layer disposed in the first insulator gap; a p-type thermoelectric layer disposed in the second insulator gap; and a metal layer disposed on the n-type thermoelectric layer, the p-type thermoelectric layer, and on the insulator between the n-type thermoelectric layer and the p-type thermoelectric layer. The apparatus may also include a plurality of energy filter layers disposed between the n-type thermoelectric layer and the barrier layer and between the p-type thermoelectric layer and the barrier layer. The plurality of energy filter layers may include graphene. The substrate may be a ceramic that is not electrically conductive and is thermally conductive. The barrier layer may include a plurality of sublayers and at least one of the plurality of sublayers is made up of at least one of: cobalt, iridium, nickel, osmium, palladium, platinum, rhenium, ruthenium, and rhodium. The n-type thermoelectric layer is made of one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—VW—Al, Yb—Ba—Co—Sb, La—Te, Pr—Te, SiGe—C, and Yb—Al; and the p-type thermoelectric layer is made of one or more of: Bi—Sb—Te, Si—Ge—B, Zintl compounds, Yb—Mn—Sb, Ce—Fe—Co—Sb, Ce—Pd, Cs—Bi—Te, Pb—Te, and Zn—Sb. The metal layer is made of a plurality of sublayers and at least one of the plurality of sublayers is made of at least one of aluminum, cobalt, gold, iridium, nickel, osmium, palladium, platinum, rhenium, ruthenium, rhodium, and titanium tungsten. A sublayer of the plurality of sublayers that is distal to the barrier layer is made of at least one of: cobalt, iridium, osmium, palladium, gold, platinum, rhenium, ruthenium, and rhodium. The apparatus may also include an overcoat layer disposed on the metal layer with a gap disposed between the n-type thermoelement layer and the p-type thermoelement layer; a metal pad disposed in the gap and adjacent on the overcoat layer;

a solder layer in contact with metal pad; a surface layer in contact with the solder layer; a second copper layer disposed on the surface layer; and a second substrate disposed on the second copper layer; where the surface layer is made of one of Ni/Au, Ni/Pd/Au, and Au; and where the solder layer is made of one of Au/Sn, Sn—Ag—Cu, and Bi—Sn.

The apparatus may also include a bonding layer disposed on the metal layer and made of at least one of: sintered silver, AuSn, eutectic solder, metallic ink, and solder. The apparatus may have a second direct bond copper substrate disposed on the bonding layer. The apparatus may include a second stage identical to the first stage and disposed on the first stage in an inverted position so that complementing thermoelectric n-type and p-type pairs are formed.

Another embodiment according to the present disclosure includes a thermoelectric apparatus, the apparatus including: a first stage including: a first stage copper substrate including: a first stage first copper layer with a first stage opening; a first stage substrate; and a first stage second copper layer (optional), wherein the first stage first copper layer and the first stage second copper layer (optional) are direct bonded or electroplated onto opposite faces of the first stage substrate; a first stage barrier layer disposed on the first stage first copper layer with a first stage opening coterminous with the first stage opening in the first stage copper layer; a first stage insulator disposed on the first stage substrate through the opening in the first stage first copper layer and the first stage opening in the first stage barrier layer and on the first stage barrier layer to form a first stage first insulator gap on one side of the first stage opening in the first stage barrier layer and a first stage second insulator gap on other side of the first stage opening in the first stage barrier layer; a thermoelectric layer disposed in the first stage first insulator gap, wherein the thermoelectric layer one of an n-type thermoelectric material and a p-type thermoelectric material; a first stage metal layer disposed on the thermoelectric layer in the first stage first insulator gap and in the first stage second insulator gap; and a first stage bonding layer disposed on the first stage metal layer; a second stage including: a second stage direct bond copper substrate including: a second stage first copper layer; a second stage substrate; and a second stage second copper layer (optional), wherein the second stage first copper layer and the second stage second copper layer (optional) are direct bonded or electroplated onto opposite faces of the second stage substrate, and wherein the second stage first copper layer is narrower than the second stage substrate to expose end surfaces of the second stage substrate; a second stage barrier layer disposed on the second stage first copper layer; a second stage insulator disposed on the second stage barrier layer with openings to form a first stage first insulator gap and a second stage insulator gap; a thermoelectric layer disposed in the second stage second insulator gap that is the other of the n-type thermoelectric material and the p-type thermoelectric material disposed in the first stage first insulator gap; and a second stage metal layer disposed on the thermoelectric layer in the second stage second insulator gap and in the second stage first insulator gap; and a second stage bonding layer disposed on the second stage metal layer. The apparatus may also include a plurality of energy filter layers disposed between each of the thermoelectric layers and their respective barrier layers. The plurality of energy filter layers may include graphene. The first stage substrate and the second stage substrate may be ceramic and not electrically conductive and is thermally conductive. Each of the first stage barrier layer and the second stage barrier layer may include a plurality of sublayers and at least one of the plurality of sublayers is made up of at least one of: cobalt, iridium, nickel, osmium, palladium, platinum, rhenium, ruthenium, and rhodium. The n-type thermoelectric layer is made of one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al; and the p-type thermoelectric layer is made of one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. The metal layer may be made of a plurality of sublayers and at least one of the plurality of sublayers is made of at least one of aluminum, cobalt, gold, iridium, nickel, osmium, palladium, platinum, rhenium, ruthenium, rhodium, tantalum/tantalum nitride, and titanium tungsten. A sublayer of the plurality of sublayers that is distal to the barrier layer may be made of at least one of: cobalt, iridium, osmium, palladium, gold, platinum, rhenium, ruthenium, and rhodium. Each of the first stage bonding layer and the second stage bonding layer may be made of at least one of: sintered silver, AuSn, eutectic solder, metallic ink, and solder.

Another embodiment according to the present disclosure includes a method of fabricating a thermoelectric device including the steps of: depositing a barrier layer on a first copper layer of a direct bonded or electroplated copper substrate; removing a portion of the barrier layer and the first copper layer to form a recess that exposes a substrate of the direct bonded or electroplated copper substrate; depositing an insulator layer on the substrate in the recess and on the barrier layer forming a first insulator gap and a second insulator gap; adding an n-type thermoelectric layer to the first insulator gap; adding a p-type thermoelectric layer to the second insulator gap; and depositing a metal layer on and between the n-type thermoelectric layer and the p-type thermoelectric layer. The method may also include the step of depositing an energy filter layer on the barrier layer in each of the first insulator gap and the second insulator gap or depositing an energy filter layer on the barrier layer on the first copper layer prior to the deposition of the insulator layer. The method may also include a step of depositing an overcoat layer on the metal layer. The method may also include the steps of forming a gap in the overcoat layer between the n-type thermoelement layer and the p-type thermoelement layer; disposing a metal pad in and adjacent to the gap; forming a second substrate with bonded copper on at least one side; disposing a surface layer on the bonded copper; disposing solder on the surface layer; and moving the first substrate and the second substrate relative to one another to join the solder to the metal pad and form a solder bond.

The method may also include a step of depositing a bonding layer on the metal layer.

Another embodiment of the present disclosure includes a method of fabricating a thermoelectric device including the steps of: forming a first stage by: depositing a first stage barrier layer on a first stage first copper layer of a first stage direct bonded or electroplated copper substrate; removing a portion of the first stage barrier layer and the first stage first copper layer to form a first stage recess that exposes a first stage substrate of the first stage direct bonded or electroplated copper substrate; depositing a first stage insulator layer on the first stage substrate in the first stage recess and on the first stage barrier layer forming a first stage first insulator gap and a first stage second insulator gap; adding a thermoelectric layer to the first stage first insulator gap, wherein the thermoelectric layer is one of: an n-type thermoelectric material and a p-type thermoelectric material; adding a p-type thermoelectric layer to the second insulator gap; and depositing a first stage metal layer on the thermoelectric layer in the first stage first insulator gap and in the first stage second insulator gap; depositing a first stage barrier layer on a first stage first copper layer of a first stage direct bonded or electroplated copper substrate; removing a portion of the first stage barrier layer and the first stage first copper layer to form a first stage recess that exposes a first stage substrate of the first stage direct bonded or electroplated copper substrate; depositing a first stage insulator layer on the first stage substrate in the first stage recess and on the first stage barrier layer forming a first stage first insulator gap and a first stage second insulator gap; adding a thermoelectric layer to the first stage first insulator gap, wherein the thermoelectric layer in the first stage first insulator gap is one of: an n-type thermoelectric material and a p-type thermoelectric material; adding a p-type thermoelectric layer to the second insulator gap; depositing a first stage metal layer on the thermoelectric layer in the first stage first insulator gap and in the first stage second insulator gap; and depositing a first stage bonding layer on the first stage metal layer; forming a second stage by: depositing a second stage barrier layer on a second stage first copper layer of a second stage direct bonded or electroplated copper substrate; removing a portion of the second stage barrier layer and the second stage first copper layer to form a second stage recess that exposes a second stage substrate of the second stage direct bonded or electroplated copper substrate; depositing a second stage insulator layer on the second stage substrate in the second stage recess and on the second stage barrier layer forming a second stage first insulator gap and a second stage second insulator gap; adding a thermoelectric layer to the second stage first insulator gap, wherein the thermoelectric layer is one of: an n-type thermoelectric material and a p-type thermoelectric material; adding a p-type thermoelectric layer to the second insulator gap; and depositing a second stage metal layer on the thermoelectric layer in the second stage first insulator gap and in the second stage second insulator gap; depositing a second stage barrier layer on a second stage first copper layer of a second stage direct bonded or electroplated copper substrate; removing a portion of the second stage barrier layer and the second stage first copper layer to form a second stage recess that exposes a second stage substrate of the second stage direct bonded or electroplated copper substrate; depositing a second stage insulator layer on the second stage substrate in the second stage recess and on the second stage barrier layer forming a second stage first insulator gap and a second stage second insulator gap; adding a thermoelectric layer to the second stage first insulator gap, wherein the thermoelectric layer in the second stage second insulator gap is the other of: the n-type thermoelectric material and the p-type thermoelectric material in the first stage first insulator gap; depositing a second stage metal layer on the thermoelectric layer in the second stage first insulator gap and in the second stage second insulator gap; depositing a second stage bonding layer on the second stage metal layer; and combining the first stage and the second stage to form a thermoelectric pair. The method may also include the step of depositing an energy filter layer on the barrier layer in each of the first insulator gap and the second insulator gap of the first stage and the second stage.

Another embodiment according to the present disclosure includes a thermoelectric apparatus, the apparatus including a first stage that includes a copper substrate that includes a first copper layer with an opening; a substrate; and a second copper layer (optional), wherein the first copper layer and the second copper layer (optional) are direct bonded or electroplated onto opposite faces of the substrate; a barrier layer disposed on the first copper layer with an opening coterminous with the opening in the first copper layer; an n-type thermoelectric layer disposed on the barrier layer on a first side of the opening; a p-type thermoelectric layer disposed on the barrier layer on a second side of the opening; metal layers disposed on and partially covering the n-type thermoelectric layer and the p-type thermoelectric layer; insulator layers disposed on portions of the n-type thermoelectric layer and the p-type thermoelectric layer that are not covered by the metal layers and the barrier layer; electroless plating layers disposed on the meal layers; and a second stage including: an interconnect fabric; a copper layer disposed on the interconnect fabric; and an electroless plating layer disposed on the copper layer; wherein bonding layers are disposed between the first stage electroless plating layer and the second stage electroless plating layer. The apparatus may also include a plurality of energy filter layers disposed between the n-type thermoelectric layer and the barrier layer and between the p-type thermoelectric layer and the barrier layer and the plurality of energy filter layers may include graphene. The substrate may be a ceramic that is not electrically conductive and is thermally conductive. The barrier layer may include a plurality of sublayers and at least one of the plurality of sublayers is made up of at least one of: cobalt, iridium, nickel, osmium, palladium, platinum, rhenium, ruthenium, rhodium, and tantalum/tantalum nitride. The n-type material may be made of one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al; and the p-type thermoelectric layer may be made of one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. The metal layer may be made of a plurality of sublayers and at least one of the plurality of sublayers is made of at least one of aluminum, cobalt, gold, iridium, nickel, osmium, palladium, platinum, rhenium, ruthenium, rhodium, tantalum/tantalum nitride, and titanium tungsten. One of the sublayers of the plurality of sublayers that is distal to the barrier layer is made of at least one of: cobalt, iridium, osmium, palladium, gold, platinum, rhenium, ruthenium, and rhodium. The apparatus may include a bonding layer disposed on the metal layer and made of at least one of: sintered silver, AuSn, eutectic solder, metallic ink, and solder. The first stage electroless plating layer and the second stage electroless plating layer both include a first sublayer of at least one of nickel and palladium; and a second sublayer of gold.

Another embodiment according to the present disclosure includes a method of fabricating a thermoelectric device including the steps of: depositing a barrier layer on a first copper layer of a direct bonded or electroplated copper substrate; removing a portion of the barrier layer and the first copper layer to form a recess that exposes a substrate of the direct bonded or electroplated copper substrate; adding an n-type thermoelectric layer to the barrier layer on a first side of the recess; adding a p-type thermoelectric layer to the barrier layer on a second side of the recess; depositing a metal layer on the n-type thermoelectric layer and the p-type thermoelectric layer; depositing an insulator layer on the barrier layer, the n-type thermoelectric layer and the p-type thermoelectric layer, and the metal layer; removing parts of the insulator layers to expose each of the metal layers; depositing an electroless plating layer on each of the metal layers; and adding interconnect fabric plated with copper and an electroless plating layer using a bonding layer between 1) each of the electroless plating layer and insulator layers corresponding to each of the n-type thermoelectric material and the p-type thermoelectric material and 2) the electroless plating layer associated with the interconnect fabric. The method may also include a step of depositing an energy filter layer on the barrier layer on the first side and the second side.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein:

FIG. 4A is a flow chart of a method for making a thermoelectric device of FIG. 1H according to one embodiment of the present disclosure;

FIG. 4B is a flow chart of a method of making at thermoelectric device of FIG. 1I according to one embodiment of the present disclosure;

FIG. 4C is a flow chart of a method of making at thermoelectric device of FIG. 2 according to one embodiment of the present disclosure;

FIG. 5 is a flow chart of a method of making at thermoelectric device of FIG. 3C according to one embodiment of the present disclosure;

FIG. 7 is a flow chart of a method for forming a thermoelectric device of FIG. 6K according to one embodiment of the present disclosure;

FIG. 9 is a flow chart of a method of making a thermoelectric device of FIG. 8E according to one embodiment of the present disclosure;

FIG. 10C is a diagram of a cross-section of the thermoelectric pair of FIG. 10B after soldering to the metal pad according to one embodiment of the present disclosure; and FIG. 11 is a flow chart of a method of making a thermoelectric device of FIG. 10C by furthering the method 400 of FIG. 4A according to one embodiment of the present disclosure.

DETAILED DESCRIPTION OF THE DISCLOSURE

Figures 1A, 1B, 1C:
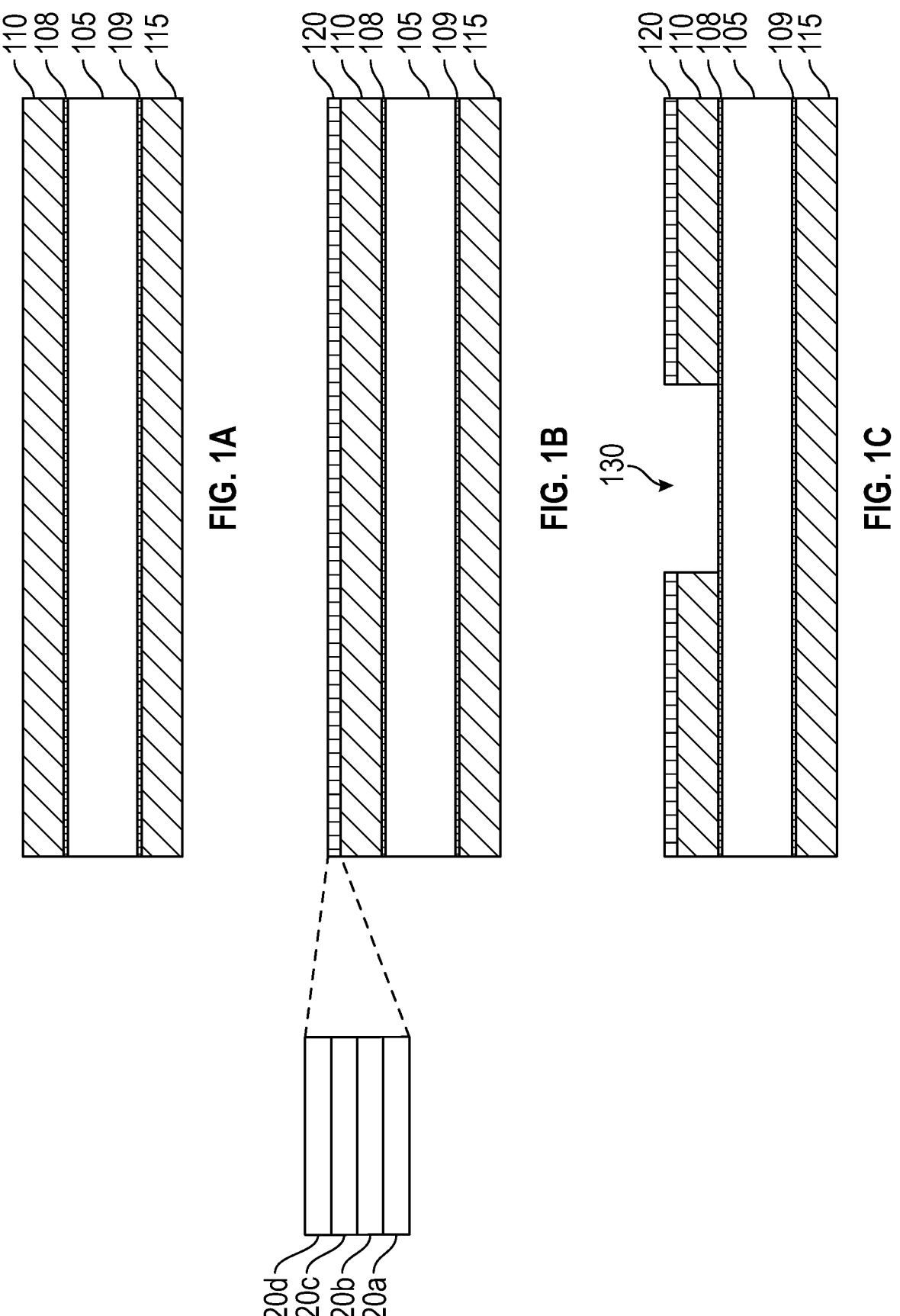
FIG. 1A is a diagram of a cross-section of a bonded substrate for a thermoelement according to one embodiment of the present disclosure.
FIG. 1B is a diagram of a cross-section of the bonded substrate of FIG. 1A with a barrier layer according to the present disclosure.
FIG. 1C is a diagram of a cross-section of the bonded or electroplated copper substrate of FIG. 1B after a recess volume has been removed according to one embodiment of the present disclosure.

Generally, the present disclosure relates to apparatuses and methods making apparatus for converting a heat energy to electrical energy and converting electrical energy into heat energy, and, in particular, generating temperature differentials and generating electrical power. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein. The figures may show exaggerated thicknesses of some of the elements so that all the elements are easily viewable.

FIGS. 1A-1G show a series of cross-section diagrams of steps of preparation of a thermoelement pair 100 on a substrate 105, such as, but not limited to, a ceramic substrate. FIG. 1A shows a cross-section diagram of a substrate 105 bonded to and sandwiched between a first copper layer 110 and a second copper layer 115. In some embodiments, the second copper layer 115 may be optional. The substrate 105 may be made of a material that is thermally conductive and not an electrical conductor. Thus, the substrate 105 may be an electrical insulator or semiconductor that is also thermally conductive. Substrate 105 may be, but is not limited to, one of: alumina, aluminum nitride, aluminum oxide, beryllium oxide, silicon, silicon carbide, diamond, boron nitride, sapphire, diamond, polyimide glass, FR4, nylon, and silicon nitride. The substrate 105 may have its surfaces covered with a thin (about 50 nanometer) electrically insulating, thermally conducting layers 108, 109. The layers 108, 109 is made of an electrical insulator and thin enough (around 50 nanometers) to not significantly impede the transmission of heat across the layer. Suitable materials for the electrically insulating, thermally conducting layer include, but are not limited to, silicon dioxide and silicon nitride. The layers 108, 109 are optional and may be used when the substrate 105 is not an electrical insulator. In some instances, the layer 108, 109 may be grown on the surface of the substrate 105 by exposing the substrate 105 to an atmosphere with oxygen or nitrogen and using suitable growing techniques as would be understood by a person of skill in the art. The copper layers 110, 115 may be about 1 micrometer to 1 millimeter in thickness. The exposed surfaces of the copper layers 110, 115 may be smoothed or planarized to ensure uniform flatness and parallelism. The copper layers 110 and 115 may be direct bond copper or electroplated copper on ceramics.

FIG. 1B shows a cross-section diagram of FIG. 1A after a barrier layer 120 has been applied to the first copper layer 110 on the side opposite the substrate 105. The barrier layer 120 may be about 1 micrometer to 1 millimeter in thickness. The barrier layer 120 may be made of multiple sublayers. In some embodiments, the barrier layer 120 may include two or more sublayers 120a, 120d. In one embodiment, the sublayer closest to the copper layer 110 may be made of nickel or palladium with thickness of about 0.5 micrometers to about 10 micrometers, and the sublayer distal to the copper layer 110, with a thickness of about 10 nanometer to about 1 micrometer, may be made of one or more of cobalt, iridium, osmium, gold, nickel, platinum, rhenium, ruthenium, and rhodium. In another embodiment, the sublayers, proceeding closest to farthest from the copper layer 110, may include a proximal sublayer of nickel 120a, a second sublayer 120b of titanium tungsten, and a distal sublayer 120c made of one or more of cobalt, iridium, nickel, osmium, palladium, gold, platinum, rhenium, ruthenium, and rhodium. The nickel sublayer 120a may have thickness of about 0.5 micrometers to 10 micrometers. The titanium tungsten sublayer 120b may have a thickness of about 10 nanometers to about 100 nanometers. The distal sublayer 120c may have a thickness of about 0.1 micrometers to about 1 micrometer. In some embodiments, the proximal sublayer 120a may be made of tantalum and have a thickness of about 5 nanometers to about 100 nanometers, a second sublayer 120b of tantalum nitride with a thickness of about 5 nanometers to about 50 nanometers, a third sublayer 120c of ruthenium with a thickness of about 5 nanometers to about 50 nanometers, and the distal sublayer 120d of iridium with a thickness of about 5 nanometers to about 50 nanometers.

FIG. 1C shows a cross-section diagram of FIG. 1B after removal of a portion of the barrier layer 120 and the first copper layer 110 to form a recess 130. The recess 130 may be formed by any suitable technique known to those of skill in the art, including, but not limited to, laser ablation and chemical etching. The recess 130 may have dimensions of about 100 micrometers. The recess 130 may have a volume of about 1000 cubic micrometers. In some embodiments, such as when the substrate 105 is made of silicon, the surface of the substrate 105 that is exposed in the recess 130 may be roughened to increase mechanical connection with layers that will be applied to the substrate 105. Roughening may involve a layer about 5 micrometers thick and be performed using single side polish, laser texturing, or other suitable techniques known to a person of ordinary skill in the art. Roughening may be performed to improve mechanical connection with the substrate 105 during manufacturing processes such as annealing.

Figures 1D, 1E, 1F:
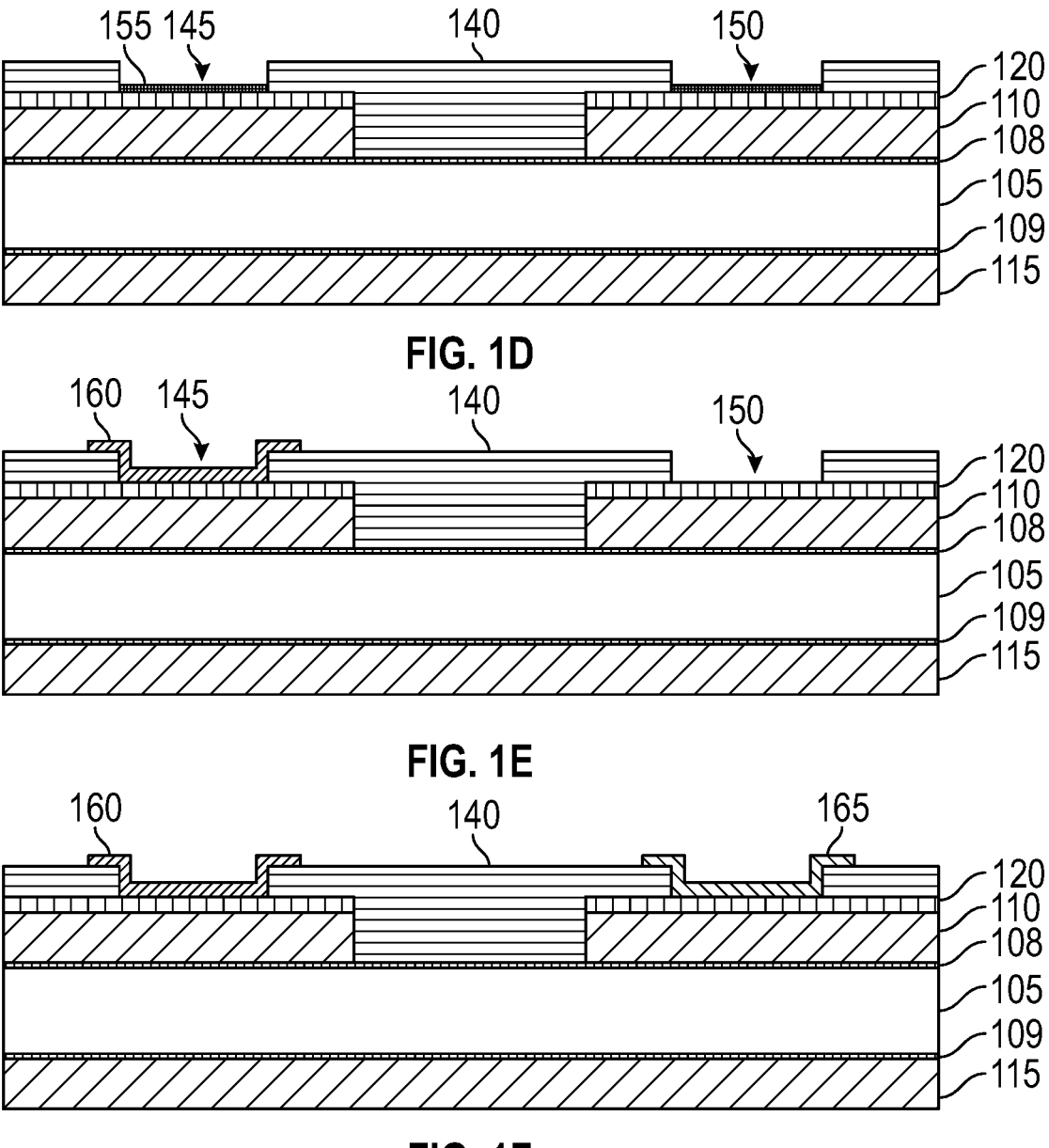
FIG. 1D is a diagram of a cross-section of the bonded substrate of FIG. 1C after an insulator layer has been added to form a pair of insulator layer gaps on the barrier layer according to one embodiment of the present disclosure.
FIG. 1E is a diagram of a cross-section of the bonded substrate of FIG. 1D after a thermoelectric material has been added to one of the pairs of insulator layer gaps according to one embodiment of the present disclosure.
FIG. 1F is a diagram of a cross-section of the bonded substrate of FIG. 1E after a thermoelectric material has been added to the other of the pair of insulator layer gaps according to one embodiment of the present disclosure.

FIG. 1D shows a cross-section diagram of FIG. 1C after an addition of an insulator layer 140. The insulator layer 140 may be any suitable organic or inorganic electrical insulator layer. The insulator layer 140 may be made of, but is not limited to, SU-8, parylene, or polyimide, or glass. The insulator layer 140 may be deposited in the recess 130 and on the surface of barrier layer 120 in a pattern that leaves insulator layer gaps 145, 150 of predetermined dimensions where the barrier layer 120 remains exposed. The insulator layer gaps 145, 150, when viewed from above, may be formed in any shape, including circles, ovals, rectangles, squares, etc. The insulator layer 140 may be deposited on the barrier layer 120 and the recess 130 to a thickness of about 1 micrometer to about 100 micrometers above the surface of the barrier layer 120, which is also the depth of the insulator layer gaps 145, 150.

In some embodiments, an optional energy filter layer 155 may be disposed on the barrier layer 120 in the insulator layer gaps 145, 150. The energy filter 155 may be only a single layer or few layers of atoms in thickness. The energy filter 155 may be configured to block the movement of low energy electrons or holes. The energy filter 155 is selected to increase the Seebeck coefficient of a thermoelectric device. The energy filter layer 155 may be made of one of graphene, twisted graphene, and 2 DEG with a thickness of about 1 nanometer.

FIG. 1E shows a cross-section diagram of FIG. 1D after an addition of an n-type thermoelectric material 160 in the insulator layer gap 145. The n-type thermoelectric material 160 may have a thickness of about 0.1 micrometers to about 100 micrometers. In some embodiments, the n-type thermo-electric material 160 may include one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al. The n-type thermoelectric material 160 may be deposited on the barrier layer 120 (or optional energy filter layer 155) and the insulator layer 140 in the insulator layer gap 145. In some embodiments, the n-type thermoelectric material 160 may also be deposited on the surface of insulator layer 140 in proximity to the insulator layer gap 145 as well.

FIG. 1F shows a cross-section diagram of FIG. 1E after an addition of a p-type thermoelectric material 165 in the insulator layer gap 150. The p-type thermoelectric material 165 may have a thickness of about 0.1 micrometers to about 100 micrometers. In some embodiments, the p-type thermo-electric material 165 may include one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. The p-type thermoelectric material 165 may be deposited on the barrier layer 120 (or optional energy filter layer 155) and the insulator layer 140 in the insulator layer gap 150. In some embodiments, the p-type thermoelectric material 165 may also be deposited on the surface of insulator layer 140 in proximity to the insulator layer gap 150 as well.

Figures 1G, 1H:
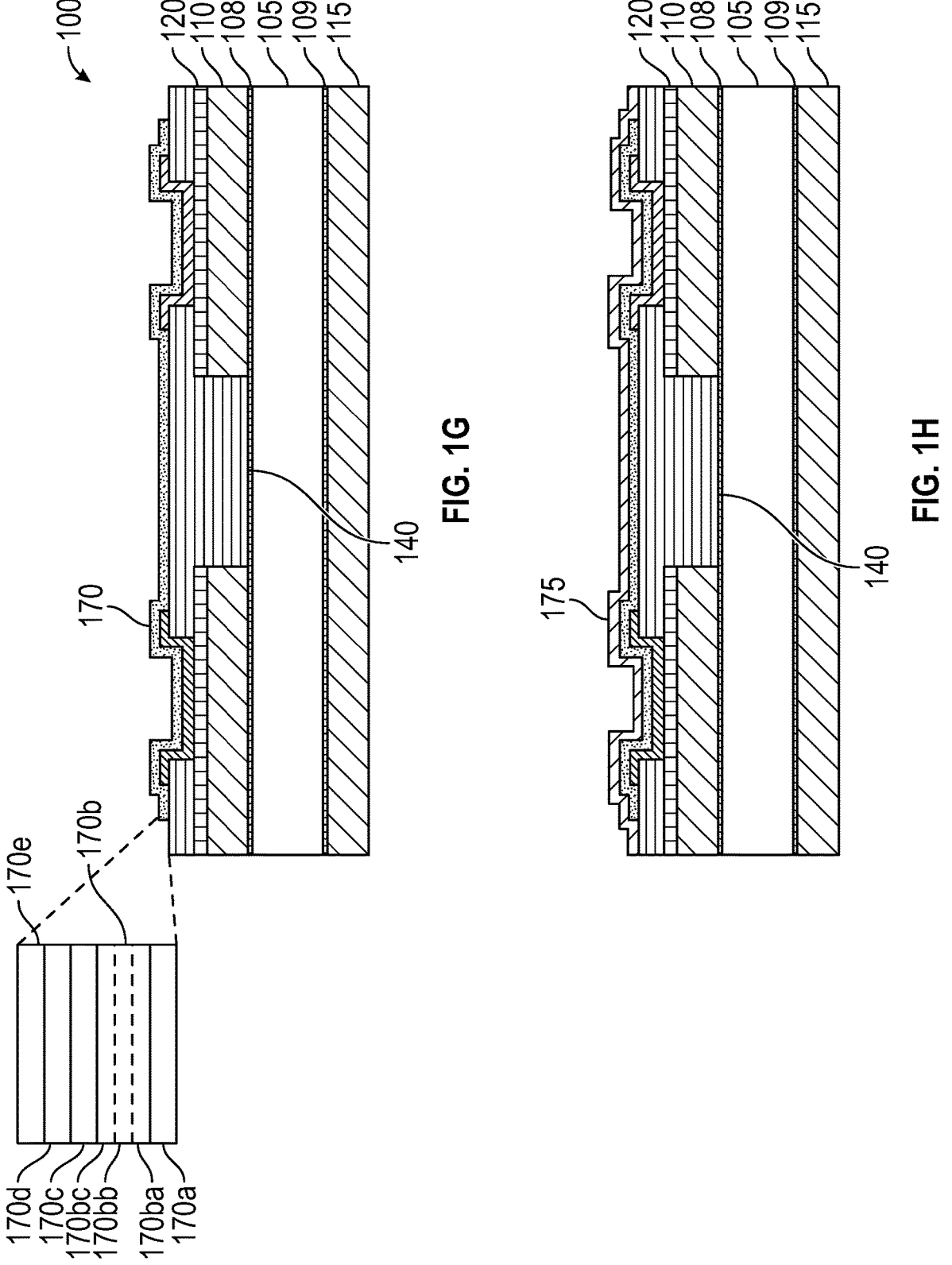
FIG. 1G is a diagram of a cross-section of a thermoelement pair made of the bonded substrate of FIG. 1F with a metal layer deposited on and between the thermoelectric materials according to one embodiment of the present disclosure.
FIG. 1H is a diagram of a cross-section of the thermoelement pair of FIG. 1G with an overcoat layer covering one surface according to one embodiment of the present disclosure.

FIG. 1G shows a cross-section diagram of the thermo-element pair 100 including the elements of FIG. 1F after a metal layer 170 has been deposited on the n-type thermo-electric material 160, the p-type thermoelectric material 165, and the surface of the insulator layer 140 between the thermoelectric materials 160, 165. As shown, the metal layer 170 provides electrical conductivity between the thermo-electric materials 160, 165; however, this is optional, and the metal layer 170 may not continuously cover the insulator layer 140 in all embodiments. The metal layer 170 may be about 0.1 micrometers to about 100 micrometers in thick-ness. The metal layer 170 may be made up of one or more of, aluminum, cobalt, gold, iridium, nickel, osmium, palla-dium, platinum, rhenium, ruthenium, rhodium, silver, and titanium tungsten. In some embodiments, the metal layer 170 may be made of multiple sublayers. For example, in one embodiment, the metal layer 170 may include a sublayer 170a proximal to the thermoelectric material 160, 165 and insulator layer 140 made of one or more of cobalt, iridium, nickel, osmium, palladium, platinum, rhenium, ruthenium, and rhodium. Adjacent to the proximal sublayer may be a second sublayer 170b of tantalum nitride, a third sublayer 170c of tantalum, a fourth sublayer 170d of silver, and fifth sublayer 170e of gold. The second sublayer 170b may be about 5 nanometers to about 50 nanometers in thickness. The third sublayer 170c may be about 5 nanometers to about 50 nanometers in thickness. The fourth sublayer 170d may be about 50 nanometers to about 5 micrometers in thickness. The fifth sublayer 170e may be about 50-200 nanometers in thickness. Some of the sublayers may be optional. In some embodiments, the second sublayer 170b may include plati-num subsublayers 170ba divided by alternating subsublay-ers 170bb, 170bc of aluminum and titanium tungsten, respectively. In other embodiments, alternating sublayers

170bb, 170bc of aluminum and titanium tungsten may be adjacent to rather than dividing the platinum sublayer.

FIG. 1H shows a cross-section diagram of the thermo-element pair 100 of FIG. 1G after an overcoat layer 175 has been deposited on the exposed surfaces of the insulator layer 140 and the metal layer 170. The overcoat layer 175 may be made of polyimide, parylene, glass, alumina, boron nitride or aluminum nitride. The overcoat layer 175 may have a thickness of about 1 micrometer.

Figure 1I:
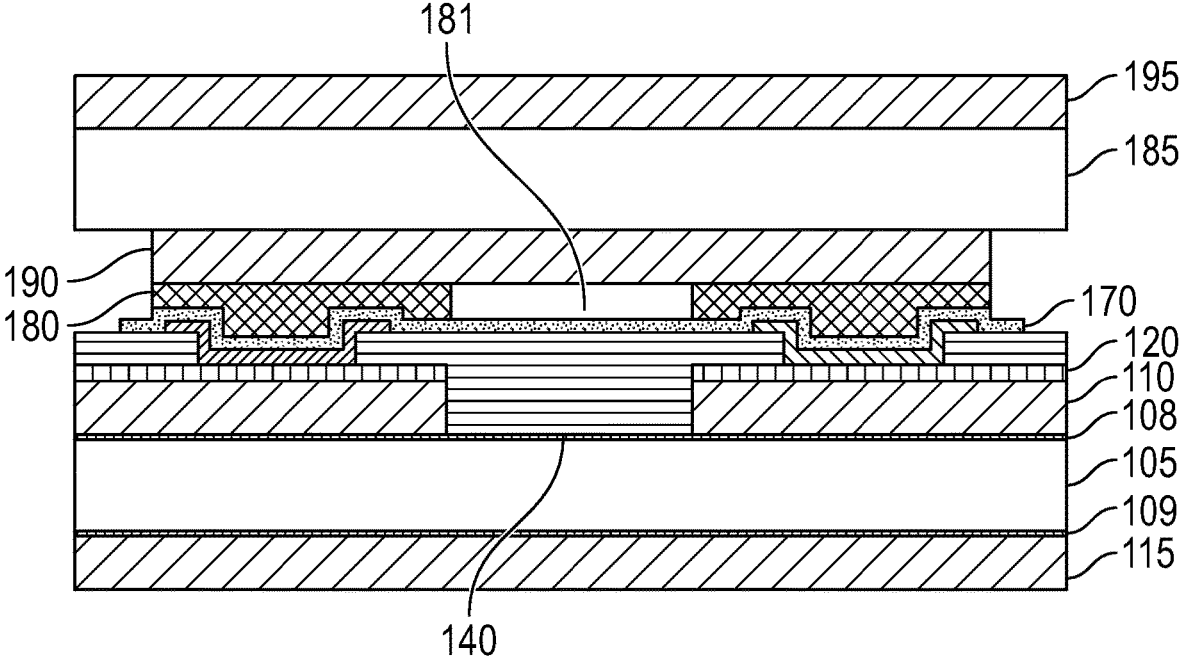
FIG. 1I is a diagram of a cross-section of a thermoelectric device including of a thermoelement pair of FIG. 1G according to one embodiment of the present disclosure.

FIG. 1I shows a cross-section diagram of the thermoele-ment pair 100 of FIG. 1G in an alternative embodiment, after a bonding layer 180 is deposited on the irregular surface of the metal layer 170 to create a flat surface and provide a thickness of about 1 micrometer to 10 micrometers beyond the peak of the metal layer 170. The bonding layer 180 is deposited to create a gap 181 bordered by the bonding layer 180, a bottom copper layer 190 (once applied as discussed below), and the metal layer 170/the insulator layer 140 (depending on the continuity of the metal layer 170. The bonding layer 180 may be made of a thermally conductive and electrically conductive suitable for the temperatures of operation of the thermoelectric pair 100, including, but not limited to one or more of: sintered silver, AuSn, eutectic solder, metallic ink, and lead-free solder. A direct bond or electroplated copper ceramic, as in FIG. 1A, may be dis-posed alongside the bonding layer 180. The direct bond or electroplated copper ceramic may be made up of a ceramic layer 185 sandwiched between a top copper layer 195 and a bottom copper layer 190. In some embodiments, the top copper layer 195 may be optional. The bonding layer 180 may be disposed between the metal layer 170 and the bottom copper layer 190 and fill available volume between these layers. The layers 185, 190, 195 may be selected from the similar material suitable for the layers 105, 110, 115. In some embodiments, the layers 185, 190, 195 may have the same thicknesses as their counterparts in the layers 105, 110, 115. In some embodiments, the bottom copper layer 190 may be truncated to a width conforming to the highest points of the metal layer 170. The truncation of the bottom copper layer 190 may be performed using laser ablation or etching or other suitable techniques known to a person of skill in the art. As would be understood by person of ordinary skill in the art, the continuity of the metal layer 170 between the thermoelectric materials 160, 165 is optional since electrical continuity is also provided by the bottom copper layer 190.

Figure 2:
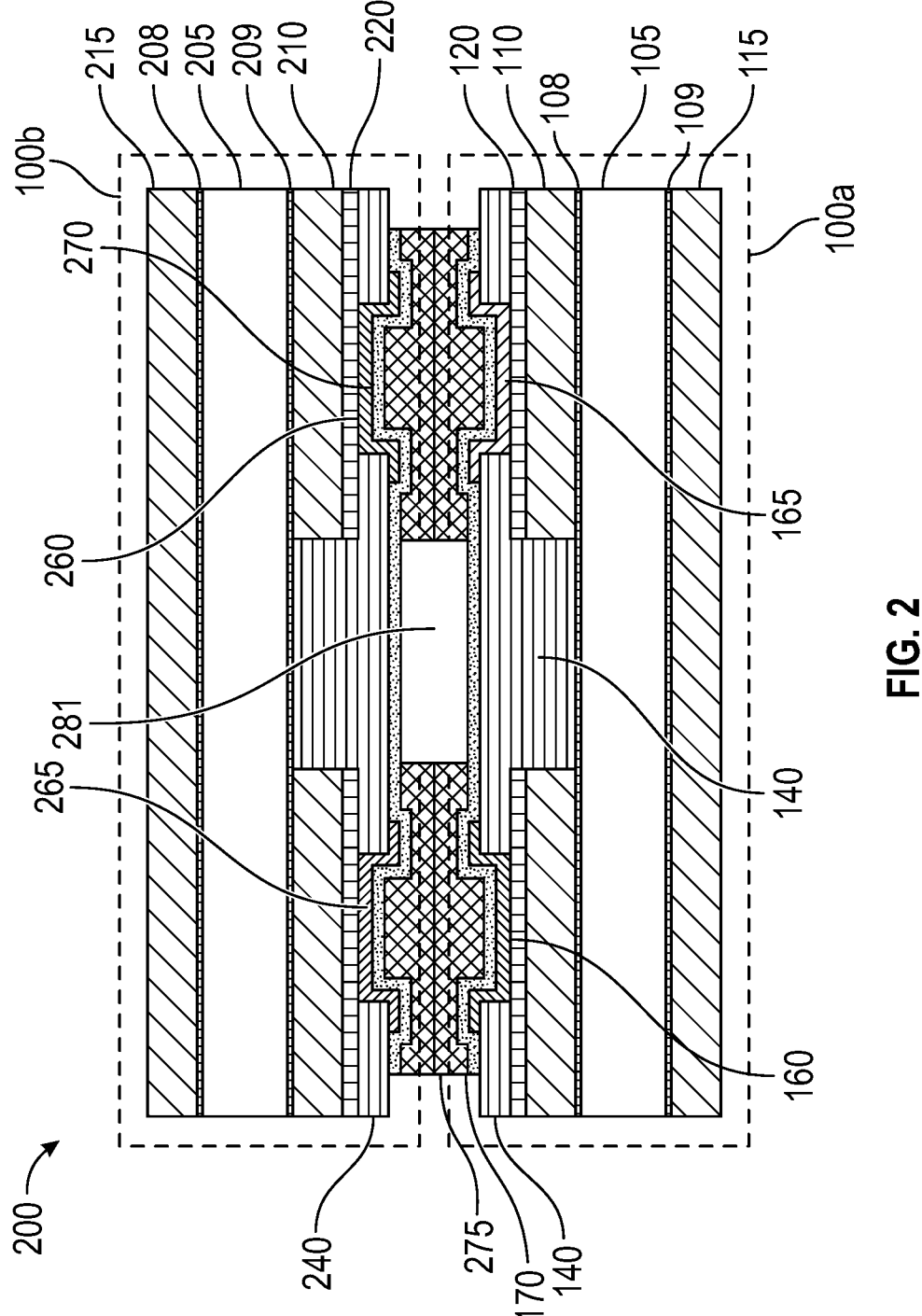
FIG. 2 is a diagram of a cross-section of a thermoelectric device including of two thermoelement pairs of FIG. 1G according to one embodiment of the present disclosure.

FIG. 2 shows a cross-section diagram of thermoelectric device 200 that includes two thermoelement pairs 100a, 100b oriented to form n-type and p-type pairs between the different thermoelement pairs 100a, 100b. The parts of the top thermoelement pair 100b include a substrate 205, a first copper layer 210, a second copper layer 215 (optional), a barrier layer 220, an insulator layer 240, an n-type thermo-electric material 260, a p-type thermoelectric material 265, and a metal layer 270, which may be made of the same materials as their counterparts (the substrate 105, the first copper layer 110, the second copper layer 115, the barrier layer 120, the insulator layer 140, the n-type thermoelectric material 160, the p-type thermoelectric material 165, and the metal layer 170) in the bottom thermoelement pair 100a. The substrate 205 may have its surfaces covered with a thin (about 50 nanometer) electrically insulating, thermally con-ducting layer 208, 209. The layer 208, 209 is made of an electrical insulator and thin enough (around 50 nanometers) to not significantly impede the transmission of heat across the layer. Suitable materials for the electrically insulating, thermally conducting layer include, but are not limited to, silicon dioxide and silicon nitride. The layers 208, 209 are optional and may be used when the substrate 205 is not an electrical insulator. In some instances, the layer 208, 209 may be grown on the surface of the substrate 205 by exposing the substrate 205 to an atmosphere with oxygen or nitrogen and using suitable growing techniques as would be understood by a person of skill in the art. In some embodiments, the surface of the substrate 205 may be roughened to increase mechanical connection with layers that will be applied to the substrate 205. Roughening may involve a layer about 5 micrometers thick and be performed using single side polish, laser texturing, or other suitable techniques known to a person of ordinary skill in the art. Roughening may be performed to improve mechanical connection with the substrate 205 during manufacturing processes such as annealing. The thicknesses of the parts 205, 210, 215, 220, 240, 255, 260, 265 of the top thermoelectric pair 100b may be 2-4 times thicker than their counterparts 105, 110, 115, 120, 140, 160, 165, 170. The space between the top and bottom portions may be filled with a layer of sintered silver 275. The bonding layer 275 may have a thickness of between 1 micrometer and 10 micrometers as measured between the narrowest gap between the metal layer 170 and the metal layer 265. The bonding layer 275 may be deposited to create a gap 281 bordered by the bonding layer 275, the metal layer 170 and the metal layer 270. In this embodiment, the metal layers 170, 270 provide electrical continuity between their respective thermoelectric materials 160, 165 and 260, 265.

Figures 3A, 3B:
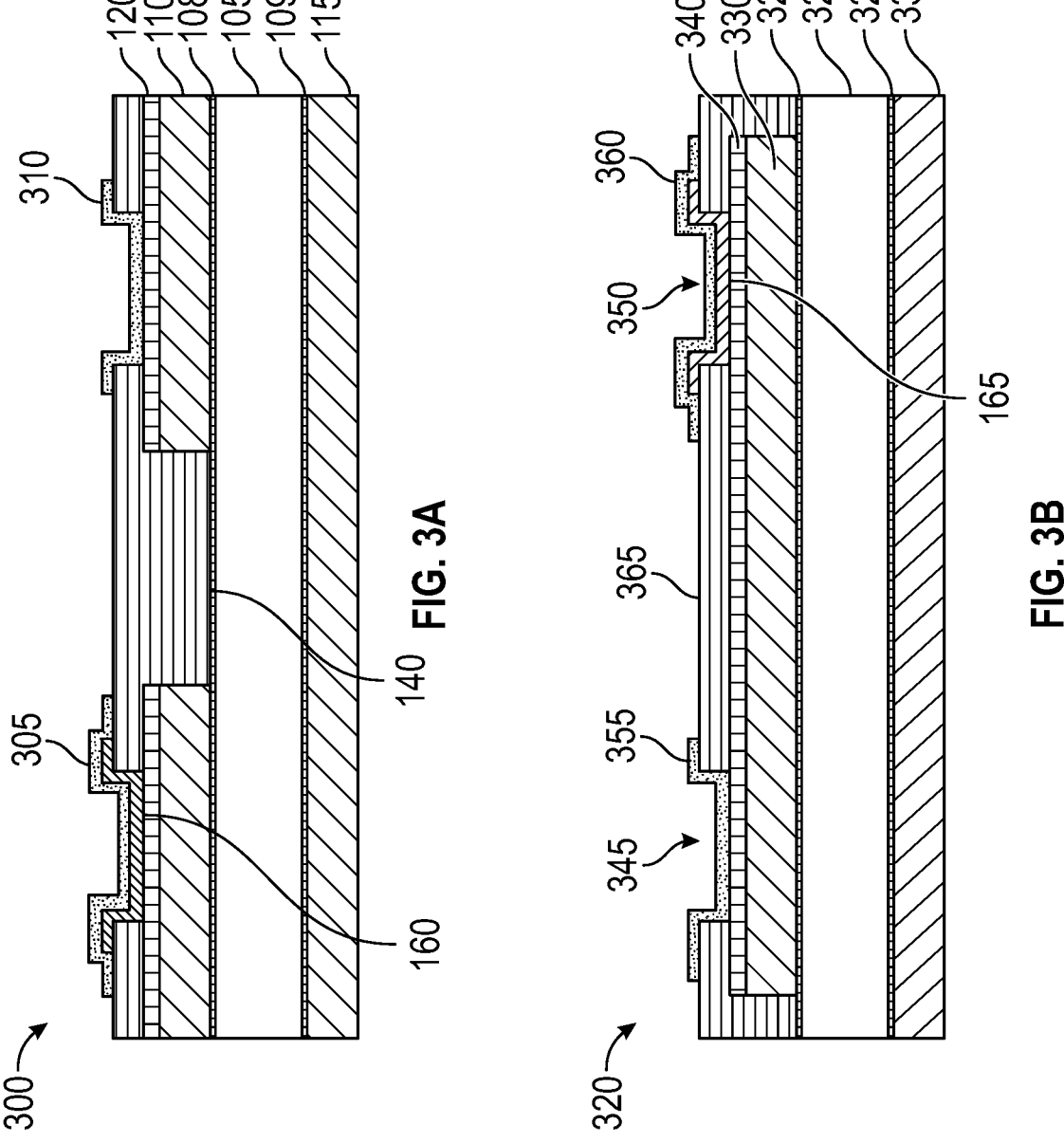
FIG. 3A is a diagram of a cross-section of a bottom portion of a thermoelectric device according to one embodiment of the present disclosure.
FIG. 3B is a diagram of a cross-section of a top portion of a thermoelectric device according to one embodiment of the present disclosure.
Figure 3C:
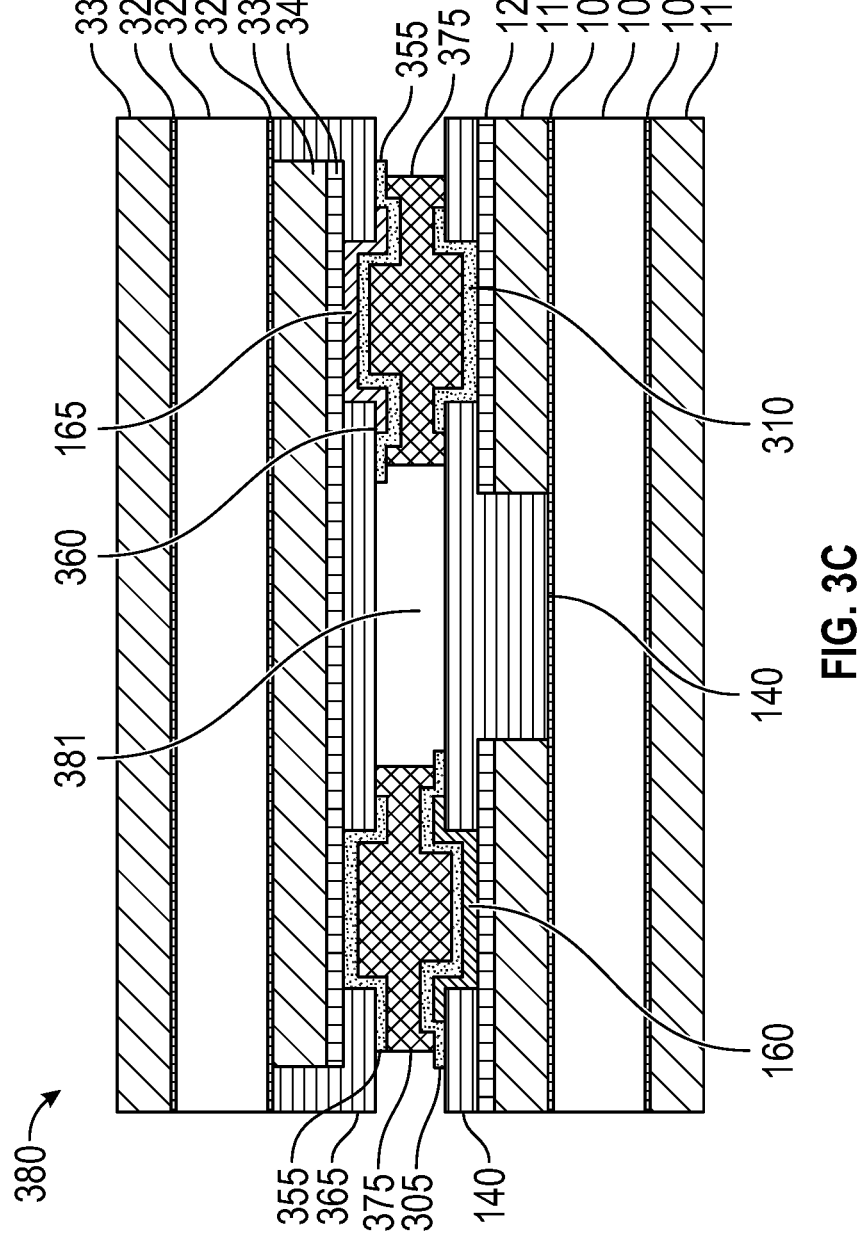
FIG. 3C is a diagram of a cross-section of a thermoelectric device formed by combining the bottom portion of FIG. 3A and the top portion of FIG. 3B for form a single thermoelectric pair according to one embodiment of the present disclosure.

FIGS. 3A-3C show cross-section diagrams of a thermoelectric pair 380 made up of a first thermoelement 300 and a second thermoelement 320. FIG. 3A shows a cross-section diagram of the first element 300, which is similar to FIG. 1E, except that metal layer 305 covers the n-type thermoelectric material 160 and metal layer 310 fills the gap in the insulator layer 140 where the p-type element would have been. Thus, the metal layer 310 makes direct contact with the barrier layer 120. The metal layers 305, 310 are shown as electrically isolated for one another; however, this is optional, and the metal layers 305, 310 may have electrical continuity as shown by the metal layer 170 in FIG. 1G. The metal layers 305, 310 may be selected from the same materials and have the same structure as the metal layer 170.

FIG. 3B shows a cross-section diagram of the second thermoelement 320, which includes a substrate 325 between a first copper layer 330 and an optional second copper layer 335, similar to the layers 105, 110, 115, respectively. The substrate 325 may have its surfaces covered with a thin (about 50 nanometer) electrically insulating, thermally conducting layer 328, 329. The layer 328, 329 is made of an electrical insulator and thin enough (around 50 nanometers) to not significantly impede the transmission of heat across the layer. Suitable materials for the electrically insulating, thermally conducting layer include, but are not limited to, silicon dioxide and silicon nitride. The layers 328, 329 are optional and may be used when the substrate 325 is not an electrical insulator. In some instances, the layer 328, 329 may be grown on the surface of the substrate 325 by exposing the substrate 325 to an atmosphere with oxygen or nitrogen and using suitable growing techniques as would be understood by a person of skill in the art. The first copper layer 330 is truncated on its ends to be shorter than the substrate 325 (and the optional second copper layer 335), leaving part of the substrate 325 exposed. A barrier layer 340 is deposited on the first copper layer 330 and may have the same composition as the barrier layer 120. An insulator layer 365 may be applied on portions of exposed surfaces of the barrier layer 340 and the substrate 325. Insulator layer gaps 345, 350 in the insulator layer 365 corresponding to the gaps 145, 150 shown in the first thermoelement 300 are present to receive p-type thermoelectric material and metal layers. The p-type thermoelectric material 165 may be deposited in one of the insulator layer gaps and covered by a metal layer 360. The other insulator layer gap may have a metal layer 355 deposited on it just as metal layer 310 is deposited in the first element 300. The metal layers 355, 360 may be selected from the same materials and have the same structure as the metal layer 170.

FIG. 3C shows a cross-section diagram of the thermoelement pair 380, which is a combination of the first thermoelement 300 and an inverted second thermoelement 320 so that a single n- and p-thermoelectric pair is formed. The open volume between the first thermoelement 300 and the second thermoelement 320 and proximate to the first insulator layer gap 345 and the second insulator layer gap 350 may be filled by bonding layers 375 with a thickness of about 1 micrometer to about 10 micrometers. The volumetric gap 381 is formed by the application of the bonding layers 375 and bordered by the bonding layers 375 and the insulator layers 140, 365.

FIG. 4A shows a flow chart of a method 400 of making the thermoelement pair 100 with an overcoat layer of FIG. 1H. In step 405, the barrier layer 120 may be deposited on the first copper layer 110, which, with the second copper layer 115 sandwich the substrate 105. In some embodiments an optional energy barrier layer 155 may be deposited on the barrier layer 120. In some embodiments, the first copper layer 110 may be planarized prior to application of the barrier layer 120. The barrier layer 120 may be about 1 micrometer in thickness. The barrier layer 120 may be made of multiple sublayers, including sublayers of tantalum, tantalum nitride, ruthenium and iridium of thickness between 5 nanometers and 50 nanometers, in order from the surface of the first copper layer 110. The substrate 105 may be made of, but is not limited to, alumina, aluminum nitride, aluminum oxide, beryllium oxide, silicon, silicon carbide, diamond, boron nitride, sapphire, diamond, polyimide glass, FR4, nylon, and silicon nitride.

In step 410, a portion of the barrier layer 120 and the first copper layer 110 is removed to expose the substrate 105 by forming the recess 130. The removal process may include, but is not limited to, laser ablation or etching. In step 415, the insulator layer 140 is added to fill the recess 130 and to cover portions of the barrier layer 120 to form a first insulator layer gap 145 and a second insulator layer gap 150. The insulator layer 140 may be deposited to a thickness of about 10 micrometers beyond the surface of the barrier layer 120. In step 420, the optional energy filter layer 155 may be deposited in the first insulator gap 145 and the second insulator gap 150 on the barrier layer 120 if an optional energy filter layer 155 was not added during step 405. The energy barrier layer 155 may have a thickness of between about 1 nanometer.

In step 425, an n-type thermoelectric material 160 may be deposited on the barrier layer 120 (or energy filter layer 155) and the insulator layer 140 in and proximate to the first insulator layer gap 145. The thickness of the n-type thermoelectric material 160 may be about 5 micrometers. In some embodiments, the n-type thermoelectric material 160 may include one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al. In step 430, a p-type thermoelectric material 165 may be deposited on the barrier layer 120 (or the energy filter layer 155) and insulator layer 140 in and proximate to the second insulator layer gap 150. The thickness of the p-type thermoelectric material 165 may be about 5 micrometers. In some embodiments, the p-type thermoelectric material 165 may include one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. In some embodiments, steps 425 and 430 may be performed in reverse order.

In step 435, the metal layer 170 may be deposited on the thermoelectric materials 160, 165 and the insulator layer 140 between the thermoelectric materials 160, 165 to provide electrical conductivity. The metal layer 170 may be made of sublayers iridium, tantalum nitride, tantalum, silver and gold. The metal layer 170 may have a thickness of about 1 micrometer. In step 440, the overcoat layer 175 may be deposited on the exposed portions of both the metal layer 170 and the insulator layer 140. The overcoat layer 175 may have a thickness of about 2 micrometers. The overcoat layer 175 may be made of boron nitride or aluminum nitride.

FIG. 4B shows a flow chart of a method 401 of making the thermoelement pair 100 with an inverted double bonded copper substrate portion of FIG. 1I. Steps 405-435 are identical those in the method 400. In step 445, a bonding layer 180 is added to the metal layer 170 to create a flat surface beyond the highest point of the metal layer 170. In step 450, the second substrate 185 with a top bonded copper layer 195 and bottom bonded copper layer 190 may be deposited on the bonding layer 180. The bottom bonded copper layer 190 may be truncated on its ends to approximately the same extent as the bonding layer 180 is present.

FIG. 4C shows a flow chart of a method 402 of making the thermoelectric device 200 as shown in FIG. 2 with a two of thermoelement pairs 100 (designated 100a and 100b) from FIG. 1G, where one is inverted in terms of orientation and thermoelectric material placement. Steps 405-435 and 445 are identical those in the method 401 in forming a thermoelement pair 100a with the bonding layer 180. In step 455, a second thermoelement 100b with the bonding layer 180 is created, with corresponding layers 205, 210, 215, 220, 240, 255, 260 to be mated with the first thermoelement 100a. In step 460, the second thermoelement 100b may be inverted and disposed on the first thermoelement 100a to form the thermoelectric device 200.

FIG. 5 shows a flow chart of a method 500 of making the thermoelectric element pair 380 that includes the thermoelectric element 300 and the thermoelectric element 320. Steps 505-535 are for the making of the thermoelectric element 300 shown in FIG. 3A. Steps 540-565 are for the making for the thermoelectric element 320 shown in FIG. 3B.

In step 505, the barrier layer 120 and an optional energy filter 155 may be deposited on the first copper layer 110, which, with the second copper layer 115 sandwich the substrate 105. In some embodiments, the first copper layer 110 may be planarized prior to application of the barrier layer 120. The barrier layer 120 may be 1 micrometer in thickness. The barrier layer 120 may be made of multiple sublayers, including sublayers of tantalum/tantalum nitride or titanium tungsten, and iridium, in order from the surface of the first copper layer 110. In some embodiments, the distal sublayer relative to the first copper layer 110 may be made of one of cobalt, iridium, osmium, palladium, gold, platinum, rhenium, ruthenium, and rhodium. The substrate 105 may be made of, but is not limited to, alumina, aluminum nitride, aluminum oxide, beryllium oxide, silicon, silicon carbide, diamond, boron nitride, sapphire, diamond, polyimide glass, FR4, nylon, and silicon nitride.

In step 510, a portion of the barrier layer 120 and the first copper layer 110 is removed to expose the substrate 105 by forming the recess 130. The removal process may include, but is not limited to, laser ablation or etching. In step 515, the insulator layer 140 is added to fill the recess 130 and to cover portions of the barrier layer 120 to from a first insulator layer gap 145 and a second insulator layer gap 150. The insulator layer 140 may be deposited to a thickness of about 10 micrometers beyond the surface of the barrier layer 120. In step 520, the optional energy filter layer 155 may be deposited in the first insulator gap 145 on the barrier layer 120 if an optional energy filter layer 155 was not added during step 505. The energy barrier layer 155 may have a thickness of about 1 nanometer.

In step 525, an n-type thermoelectric material 160 may be deposited on the barrier layer 120 (or the energy filter layer 155) and the insulator layer 140 in and proximate to the first insulator layer gap 145. The thickness of the n-type thermoelectric material 160 may be about 5 micrometers. In some embodiments, the n-type thermoelectric material 160 may include one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al.

In step 530, the metal layer 305 may be deposited on the n-type thermoelectric material 160. In step 535, the metal layer 310 may be deposited on the barrier layer 120 in the second insulator layer gap 150. The metal layers 305, 310 may be made of sublayers iridium, tantalum, tantalum nitride, silver, and gold. The metal layers 305, 310 may have thicknesses of about 1 micrometer. This completes the formation of the first thermoelectric element 300.

In step 540, the barrier layer 340 and an optional energy filter 155 may be deposited on the first copper layer 330, which, with the second copper layer 335 sandwich the substrate 325. In some embodiments, the first copper layer 330 may be planarized prior to application of the barrier layer 340. The barrier layer 340 may be 1 micrometer in thickness. The barrier layer 340 may be made of multiple sublayers, including sublayers of tantalum/tantalum nitride or titanium tungsten, and iridium, in order from the surface of the first copper layer 330. In some embodiments, the distal sublayer relative to the first copper layer 330 may be made of one of cobalt, iridium, nickel, osmium, palladium, platinum, rhenium, ruthenium, and rhodium. The substrate 325 may be made of, but is not limited to, alumina, aluminum nitride, aluminum oxide, beryllium oxide, silicon, silicon carbide, diamond, boron nitride, sapphire, diamond, polyimide glass, FR4, nylon, and silicon nitride.

In step 545, a portion of the barrier layer 340 and the first copper layer 330 is removed to expose the substrate 325 at its ends. The removal process may include, but is not limited to, laser ablation or etching. In step 550, the insulator layer 365 is added on the exposed substrate 325 and portions of the barrier layer 340 to form the first insulator layer gap 345 and the second insulator layer gap 350. The insulator layer 365 may be deposited to a thickness of about 10 micrometers beyond the surface of the barrier layer 340. In step 555, the optional energy filter layer 155 may be deposited in the second insulator gap 350 on the barrier layer 340 if the optional energy filter layer 155 was not deposited during step 540. The energy barrier layer 155 may have a thickness of between about 1 nanometer.

In step 560, a p-type thermoelectric material 165 may be deposited on the barrier layer 120 (or the energy filter layer 155) and insulator layer 365 in and proximate to the second insulator layer gap 350. The thickness of the p-type ther-moelectric material 165 may be about 5 micrometers. In some embodiments, the p-type thermoelectric material 165 may include one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb.

In step 565, the metal layer 360 may be deposited on the p-type thermoelectric material 165. In step 570, the metal layer 355 may be deposited on the barrier layer 340 in the first insulator layer gap 345. The metal layers 355, 360 may be made of sublayers iridium, tantalum, tantalum nitride, silver, and gold. The metal layers 355, 360 may have thicknesses of about 1 micrometer. This completes the formation of the second thermoelectric element 320.

In step 575, the second thermoelectric element 320 may be inverted and positioned on the first thermoelectric ele-ment 300 to the thermoelement pair 360. In step 580, the volume between the metal layers 305, 355 and between the metal layers 310, 360 are filled with sintered silver 375. In some embodiments, the bonding layer 375 may be applied to the first thermoelement 300 and the second thermoelectric element 320 prior to positioning to form the thermoelectric element pair 380.

Figure 6A:
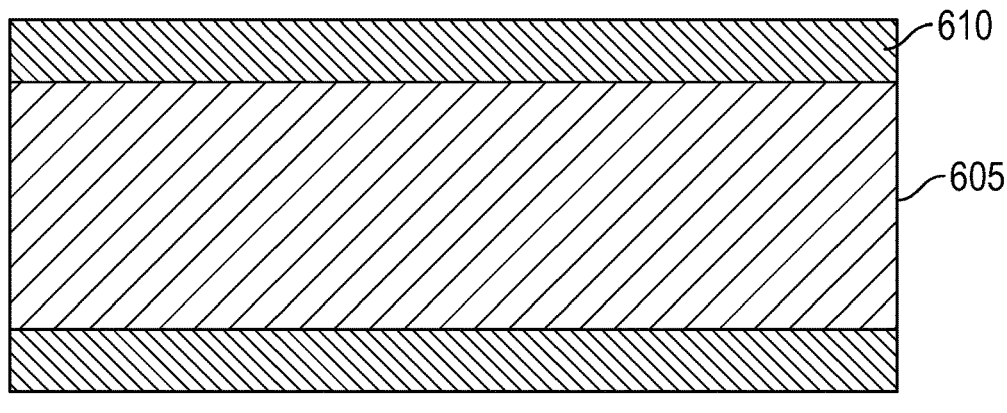
FIG. 6A is a diagram of a cross-section of a thermally oxidized silicon substrate according to one embodiment of the present disclosure.
Figure 6B:
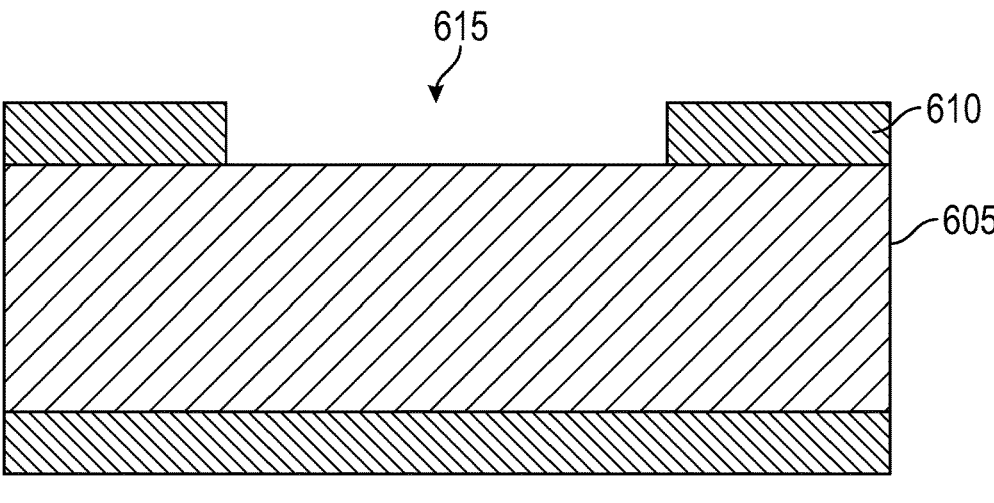
FIG. 6B is a diagram of a cross-section of the thermally oxidized silicon substrate of FIG. 6A with a portion of the thermal oxide layer removed according to one embodiment of the present disclosure.
Figure 6C:
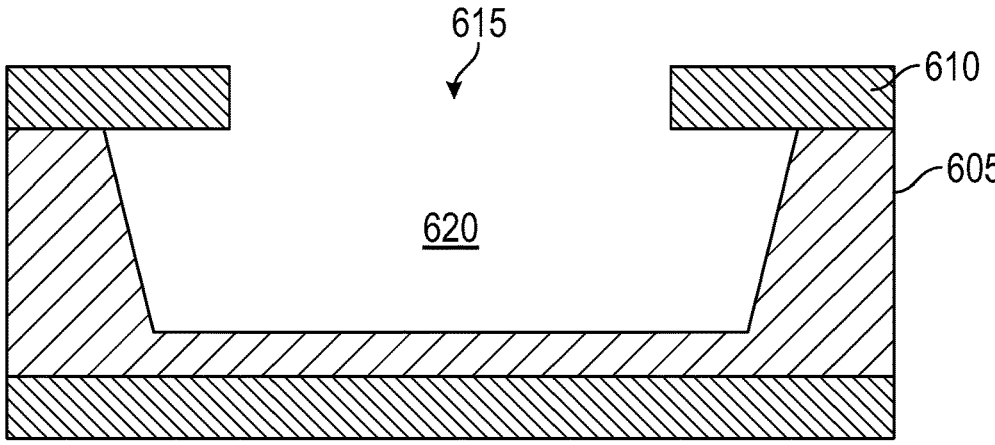
FIG. 6C is a diagram of a cross-section of the thermally oxidized silicon substrate of FIG. 6B with a portion of the silicon substrate removed according to one embodiment of the present disclosure.
Figure 6D:
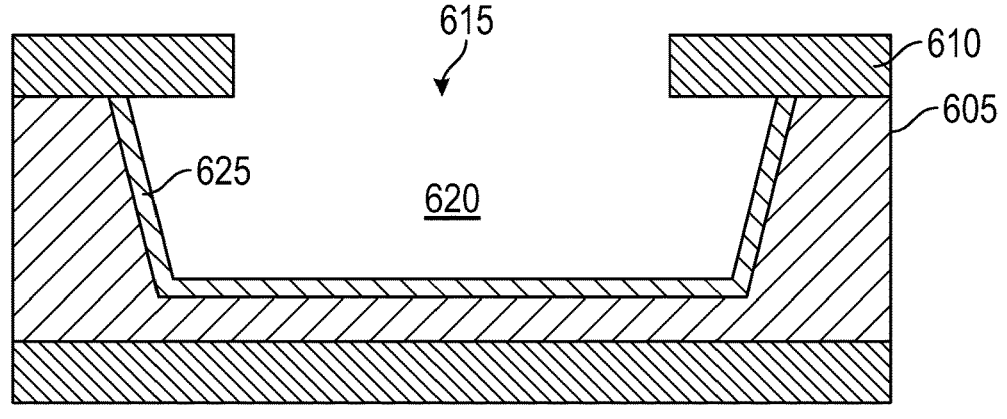
FIG. 6D is a diagram of a cross-section of the thermally oxidized silicon substrate of FIG. 6C with the exposed surface face of the silicon substrate oxidized according to one embodiment of the present disclosure.
Figure 6E:
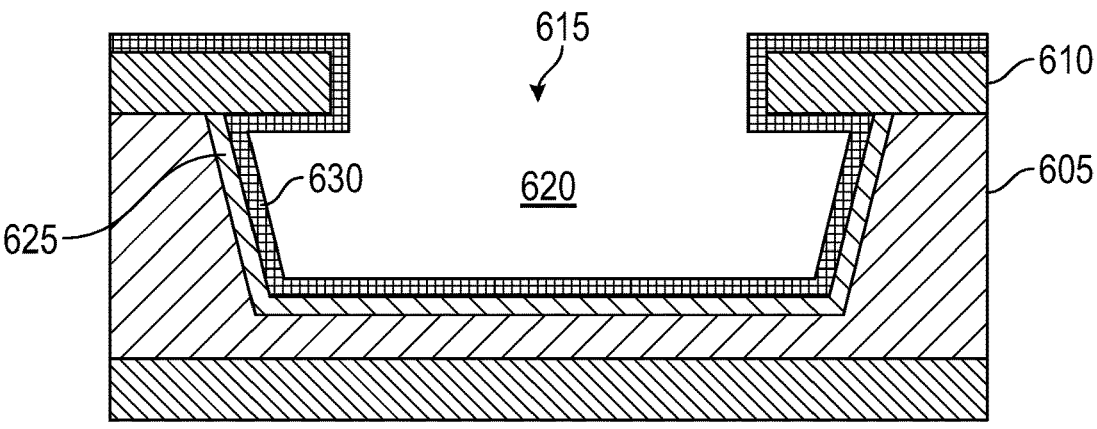
FIG. 6E is a diagram of a cross-section of the thermally oxidized silicon substrate of FIG. 6D with an atomic-layer deposition seed layer according to one embodiment of the present disclosure.
Figure 6F:
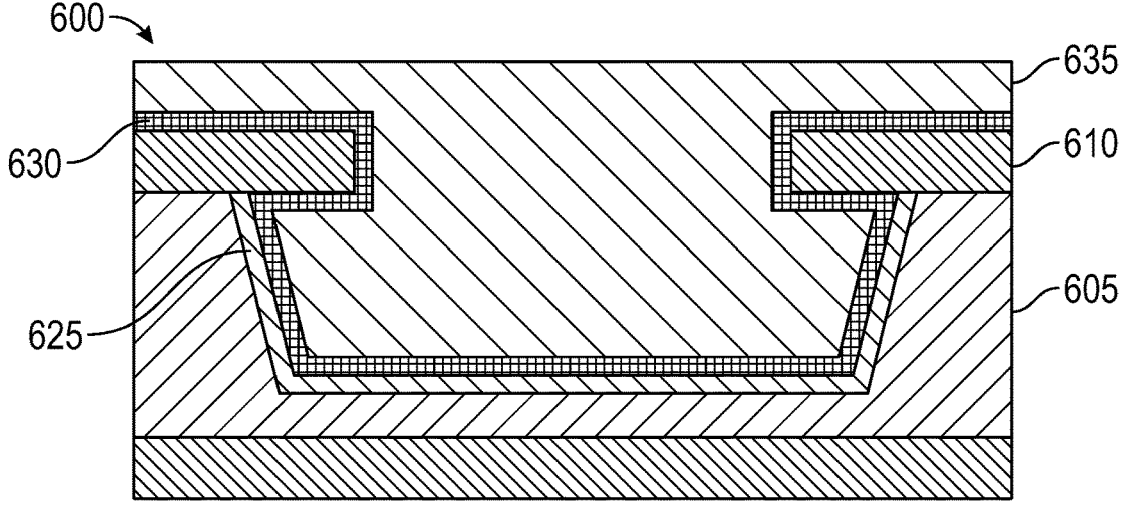
FIG. 6F is a diagram of a cross-section of the thermally oxidized silicon substrate of FIG. 6E with a plating layer according to one embodiment of the present disclosure.

FIGS. 6A-6F show cross-section diagrams of silicon starting substrates in various stages of development, culmi-nating in a plated substrate 600 in FIG. 6F. FIG. 6A shows a cross-section diagram of a silicon substrate 605 with a thermal oxide layer 610. The thermal oxide layer 610 may be about 250 nm in thickness and composed of silicon dioxide. The thermal oxide layer 610 may be present on one or both surfaces of the silicon substrate 605.

FIG. 6B shows a cross-section diagram of FIG. 6A after the removal of a portion of the thermal oxide layer 610 to form a recess 615 and expose a portion of the silicon substrate 605. The removal of thermal oxide material may be performed by wet etching using buffered hydrofluoric acid or by plasma reactive ion etching (RIE) using suitable techniques known those of skill in the art.

FIG. 6C shows a cross-section diagram of FIG. 6B after a volume of the silicon substrate 605 has been removed to form volume 620. The volume 620 may be formed by wet-etching methods, such as etching with potassium hydroxide. The volume 620 may extend beneath the thermal oxide layer 610 in at least one dimension. The volume 620 may have a depth of about 10 to 25 micrometers.

FIG. 6D shows a cross-section diagram of FIG. 6C after a re-oxidation layer 625 is formed on the exposed portion of the silicon substrate 605 adjacent to the volume 620. The re-oxidation layer 625 may be added by a process of thermal oxidation. The re-oxidation layer 625 may be composed of silicon dioxide. The layer 625 may be substituted by silicon nitride deposited by low pressure chemical vapor deposition (LPCVD).

FIG. 6E shows a cross-section diagram of FIG. 6D after the addition of an atomic-layer deposited (ALD) seed layer 630 the re-oxidation layer 625 and the exposed surfaces of the thermal oxide layer 610. The ALD seed layer 630 may have a thickness of about 10 nanometers to about 100 nanometers. The ALD seed layer 630 may be made of platinum, cobalt, or conductive carbon.

FIG. 6F shows a cross-section diagram of the plated substrate 600, which include the elements shown in FIG. 6E and a plating layer 635. The plating layer 635 may be made of gold, nickel, palladium, silver, or copper. The plating layer 635 may be deposited to fill the volume 620 and cover ALD seed layer 630. The plating layer 635 may have a thickness of at least 5 micrometers. The plated substrate 600 may be used in place of the substrate 105 and copper layers 110, 115 in the methods 400, 401, 402, 403. The plating layer 635 fills the volume 620 to form an attachment between the plating layer 635 and the silicon substrate 605.

Figures 6G, 6H:
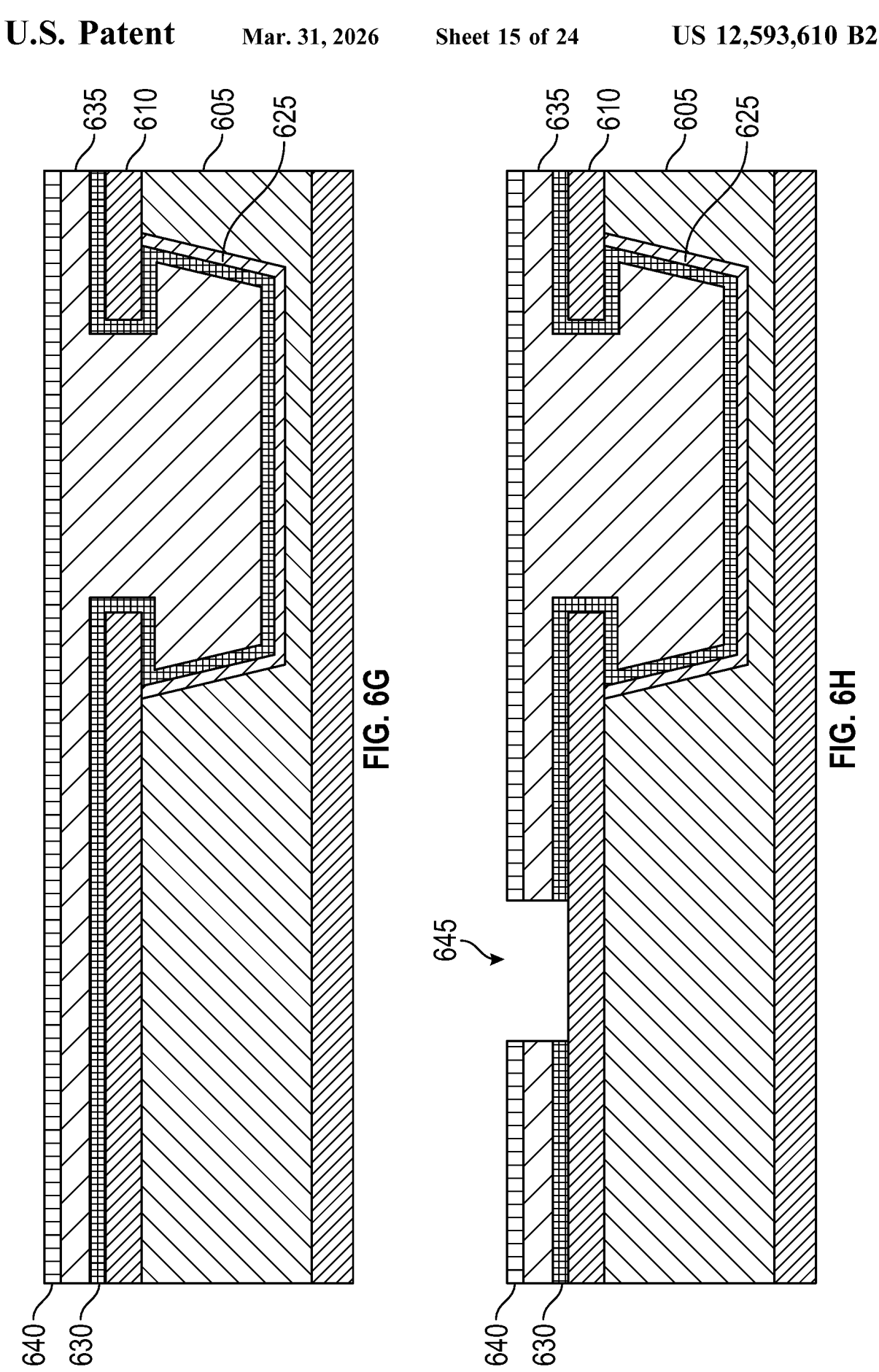
FIG. 6G is a diagram of a cross-section of the thermally oxidized silicon substrate of FIG. 6F with a barrier layer added to the plating layer according to one embodiment of the present disclosure.
FIG. 6H is a diagram of a cross-section of the thermally oxidized silicon substrate of FIG. 6G after a recess volume has been removed according to one embodiment of the present disclosure.

FIG. 6G shows a cross-section diagram of the plated substrate 600 shown in FIG. 6F after the addition of a barrier layer 640 and an optional energy filter 155. The barrier layer 640 may be selected from the same materials and thick-nesses as the barrier layer 120 and energy filter layer 155.

FIG. 6H shows a cross-section diagram of the plated substrate 600 in FIG. 6G after the formation of a recess 645. The recess 645 exposes the thermal oxide layer 610 after removal of portions of the barrier layer 640, the plating layer 635, and the ALD seed 630.

Figures 6I, 6J:
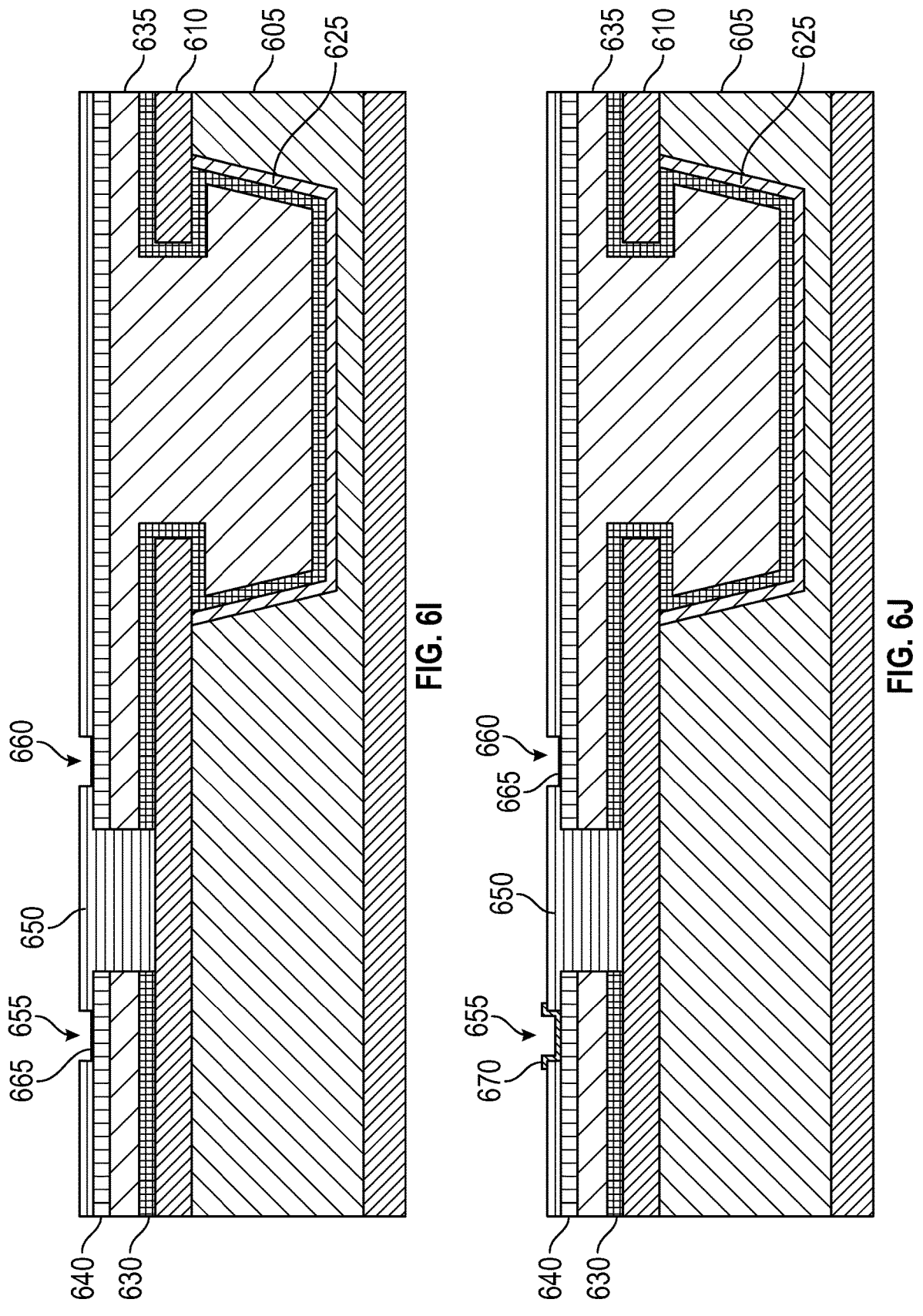
FIG. 6I is a diagram of a cross-section of the thermally oxidized silicon substrate of FIG. 6H after an insulator layer has been added to form a pair of insulator layer gaps on the barrier layer according to one embodiment of the present disclosure.
FIG. 6J is a diagram of a cross-section of the thermally oxidized silicon substrate of FIG. 6I after a thermoelectric material has been added to one of the pairs of insulator layer gaps according to one embodiment of the present disclosure.

FIG. 6I shows a cross-section diagram of the plated substrate 600 in FIG. 6H after the addition of an insulator layer 650 in the recess 645 and on the barrier layer 640 to form a first insulator layer gap 655 and a second insulator layer gap 660. The insulator layer 650 may be made of the same material as the insulator layer 140. In some embodi-ments, an optional energy filter layer 665 may be deposited on the barrier layer 640 in one or both of the first insulator gap 655 and the second insulator gap 660. The energy filter 665 may be only a single layer or few layers of atoms in thickness. The energy filter 665 may be configured to block the movement of low energy electrons or holes. The energy filter 665 is selected to increase the Seebeck coefficient of the thermoelectric device.

FIG. 6J shows a cross-section diagram of the plated substrate 600 in FIG. 6I after the addition of an n-type thermoelectric material 670 in and proximate to the first insulator layer gap 655. The n-type thermoelectric material 670 may be selected from any of the materials suitable for the n-type thermoelectric material 160.

Figures 6K, 6L:
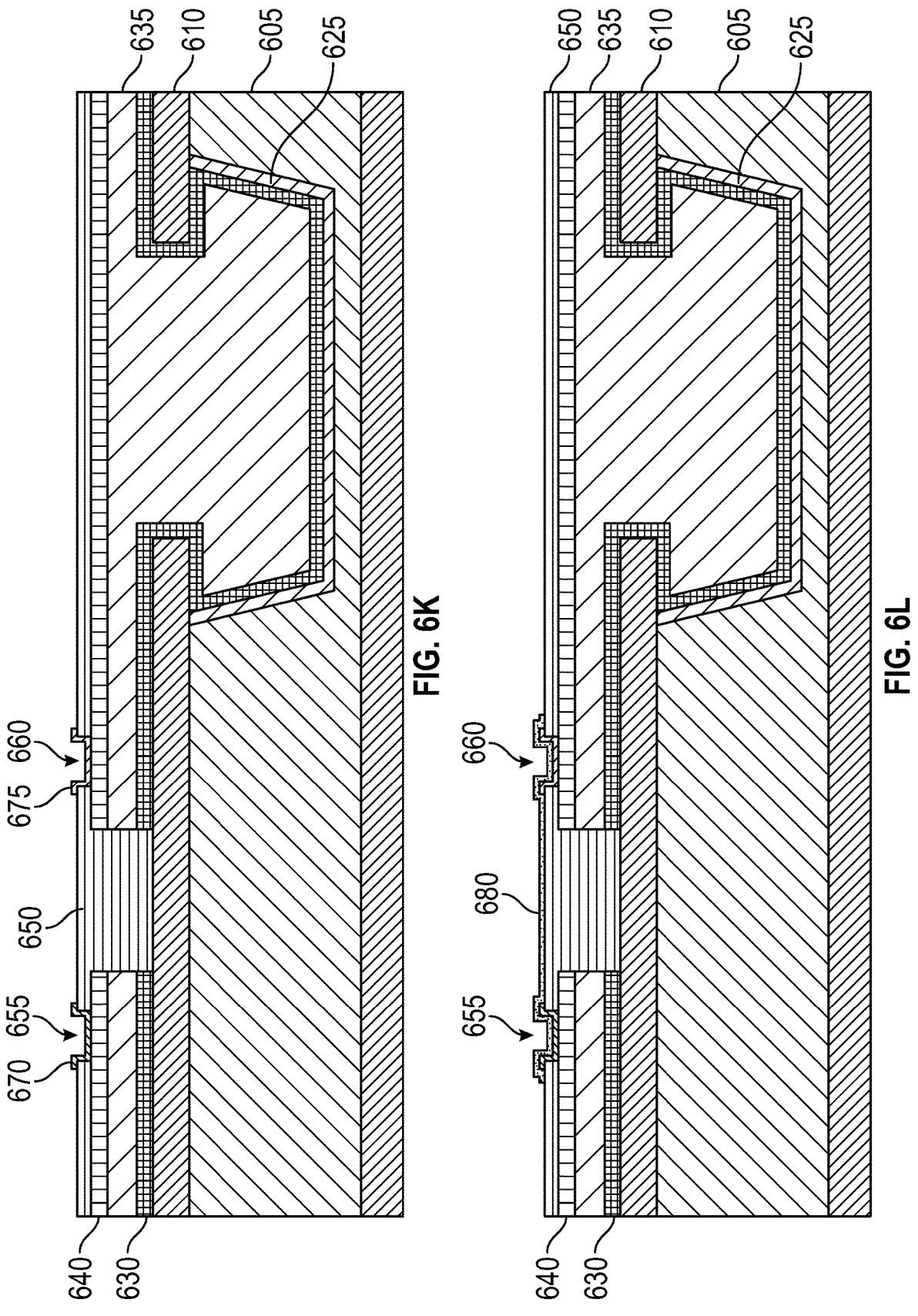
FIG. 6K is a diagram of a cross-section of the thermally oxidized silicon substrate of FIG. 6J after a thermoelectric material has been added to the other of the pair of insulator layer gaps according to one embodiment of the present disclosure.
FIG. 6L is a diagram of a cross-section of a thermoelement pair made of the thermally oxidized silicon substrate of FIG. 6K with a metal layer deposited on and between the thermoelectric materials according to one embodiment of the present disclosure.

FIG. 6K shows a cross-section diagram of the plated substrate 600 in FIG. 6J after the addition of an p-type thermoelectric material 675 in and proximate to the insulator layer gap 660. The p-type thermoelectric material 675 may be selected from any of the materials suitable for the p-type thermoelectric material 165.

FIG. 6L shows a cross-section diagram of the plated substrate 600 in FIG. 6K after the addition of a metal layer 680 on the n-thermoelement material 670, the p-thermoele-ment material 675, and on the exposed surface of the insulator layer 650 between the insulator layer gaps 655, 660 to provide electrical continuity between the n-thermoele-ment material 670 and the p-thermoelement material 675 and form a thermoelectric pair 680. The metal layer 680 may be made of the same materials and have the same thick-nesses as the various embodiments of the metal layer 170. While this figure shows the n-type thermoelement material 670 and the p-type thermoelement material 675 similar to the configuration in FIG. 1G, a person of skill in the art would appreciate that the thermoelectric pair 680 may be used as a substitute for the direct bond or electroplated copper substrate (105, 110, 115) in any of its embodiments, including FIGS. 1H, 1I, 2, and 3.

FIG. 7 shows a flow chart for a method 700 of making the thermoelectric pair 680 of FIG. 6L. In step 705, a silicon substrate 605 may be thermally oxidized to form a thermal oxide layer 610 of silicon dioxide that is about 100 nano-meters to about 1 micrometer in thickness. In step 710, the recess 615 is formed by removing part of the thermal oxide layer 610 to expose the silicon substrate 605. The recess 615 may be formed or shaped to increase mechanical grip between the silicon substrate 605 and the plating layer 635 (see step 730). The increased grip reduced the risk of delamination between the silicon substrate 605 and the plating layer 635 during manufacturing, such as during annealing. In step 715, a volume 620 of the silicon substrate 605 may be removed in a shape that has at least one dimension greater than the cross-section of the recess 615. The volume 620 may be removed through laser ablation, chemical etching, reactive ion etching, or other suitable techniques known to a person of skill in the art.

In step 720, the exposed surface of the silicon substrate 605 adjacent to the volume 620 may be thermally oxidized to form a re-oxidation layer 625, which may have at thickness of about 50 nanometers to about 500 nanometers. In step 725, the ALD seed layer 630 may be deposited on the re-oxidation layer 625. In step 730, the plating layer 635 may be deposited on the ALD seed layer 630. Once solidified, the plating layer 635 will form a structure that holds fast to the thermal oxide layer 610 in the constriction made from the opening 615 being smaller than the volume 620 in at least one cross-sectional dimension.

In step 735, the barrier layer 640 may be deposited on the plating layer 635. In some embodiments, the plating layer 635 may be planarized prior to application of the barrier layer 640. The barrier layer 640 may be about 1 micrometer in thickness. The barrier layer 640 may be made of multiple sublayers, including sublayers of tantalum/tantalum nitride or titanium tungsten, and iridium, in order from the surface of the plating layer 635. In some embodiments, the distal sublayer relative to the plating layer 635 may be made of one of cobalt, iridium, nickel, osmium, palladium, platinum, rhenium, ruthenium, and rhodium, which may vary in thickness from about 50 nanometers to about 1 micrometer depending on which of the elements is used.

In step 740, a portion of the barrier layer 640, the plating layer 635, the ALD seed layer 630, the thermal oxide layer 610, and the substrate 605 is removed to expose the substrate 605 by forming the recess 645. The removal process may include, but is not limited to, laser ablation or etching. In step 745, the insulator layer 650 is added to fill the recess 645 and to cover portions of the barrier layer 640 to form a first insulator layer gap 655 and a second insulator layer gap 660. The insulator layer 650 may be deposited to a thickness of about 25 micrometers beyond the surface of the barrier layer 640. In step 750, the optional energy filter layer 665 may be deposited in the first insulator gap 655 and the second insulator gap 660 on the barrier layer 640. The energy barrier layer 665 may have a thickness of between about 500 picometers and about 5 nanometers and selected from the same materials as the energy barrier layer 155.

In step 755, an n-type thermoelectric material 670 may be deposited on the barrier layer 640 (or the energy filter layer 665) and the insulator layer 650 in and proximate to the first insulator layer gap 655. The thickness of the n-type thermoelectric material 670 may be about 5 micrometers. In some embodiments, the n-type thermoelectric material 655 may include one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al. In step 760, a p-type thermoelectric material 675 may be deposited on the barrier layer 640 (or the energy filter layer 665) and insulator layer 650 in and proximate to the second insulator layer gap 660. The thickness of the p-type thermoelectric material 675 may be about 5 micrometers. In some embodiments, the p-type thermoelectric material 675 may include one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. In some embodiments, steps 755 and 760 may be performed in reverse order.

In step 765, layer the metal layer 680 may be deposited on the thermoelectric materials 670, 675 and the insulator layer 650 between the thermoelectric materials 670, 675 to provide electrical conductivity and complete the thermoelement pair 680. The metal layer 680 may be made of sublayers iridium, tantalum, tantalum nitride, silver, and gold. The metal layer 680 may have a thickness of about 1 micrometer.

Figures 8A, 8B, 8C:
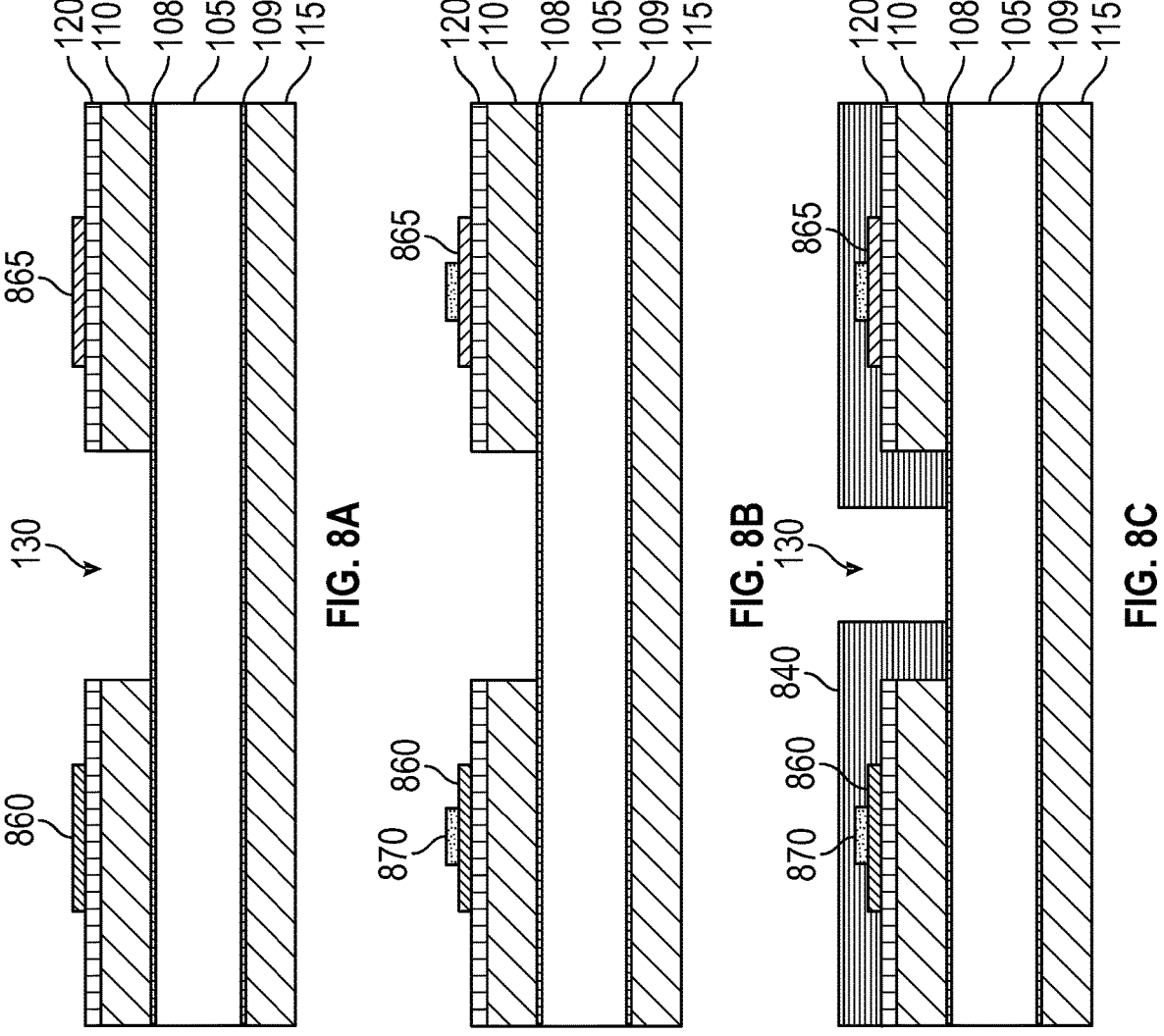
FIG. 8A is a diagram of a cross-section of a substrate of FIG. 1C after thermoelectric materials have been added to the barrier layer on opposite sides of the recess according to one embodiment of the present disclosure.
FIG. 8B is a diagram of a cross-section of a thermoelement pair of FIG. 8A after metal layers have been deposited on the thermoelectric materials according to one embodiment of the present disclosure.
FIG. 8C is a diagram of a cross-section of a thermoelement pair of FIG. 8B after insulator layers have been deposited on the barrier layers, metal layers, and thermoelectric materials according to one embodiment of the present disclosure.

FIGS. 8A-8E show a series of cross-section diagrams of steps of preparation of another embodiment of a thermoelement pair 800 according to the present disclosure. FIG. 8A builds on FIG. 1C and includes an n-type thermoelectric material 860 deposited on the barrier layer 120 and a p-type thermoelectric material 865 deposited on the barrier layer 120. The thermoelectric materials 860, 865 are on separate sides of the recess 130. The n-type thermoelectric material 860 may be selected from the same materials using in the n-type thermoelectric material 160, and the p-type thermoelectric material 865 may be selected from the same materials using in the p-type thermoelectric material 165.

FIG. 8B shows a cross-section diagram of FIG. 8A after the addition of metal layers 870, which may have the same construction and materials as the metal layer 170. Each of the metal layers 870 is deposited on the respective thermoelectric material layers 860, 865. As shown, the metal layers 870 leave at least some of the surface of the thermoelectric layers 860, 865 exposed.

FIG. 8C shows a cross-section diagram of FIG. 8B after the addition of insulator layers 840 on both sides of the recess 130. The insulator layers 840 cover the respective thermoelectric layers 860, 865, the metal layers 870, the barrier layers 120, and the exposed portions of the first copper layer 110 in the recess 130. The insulator layers 840 may be made of the same materials as the insulator layer 140.

Figures 8D, 8E:
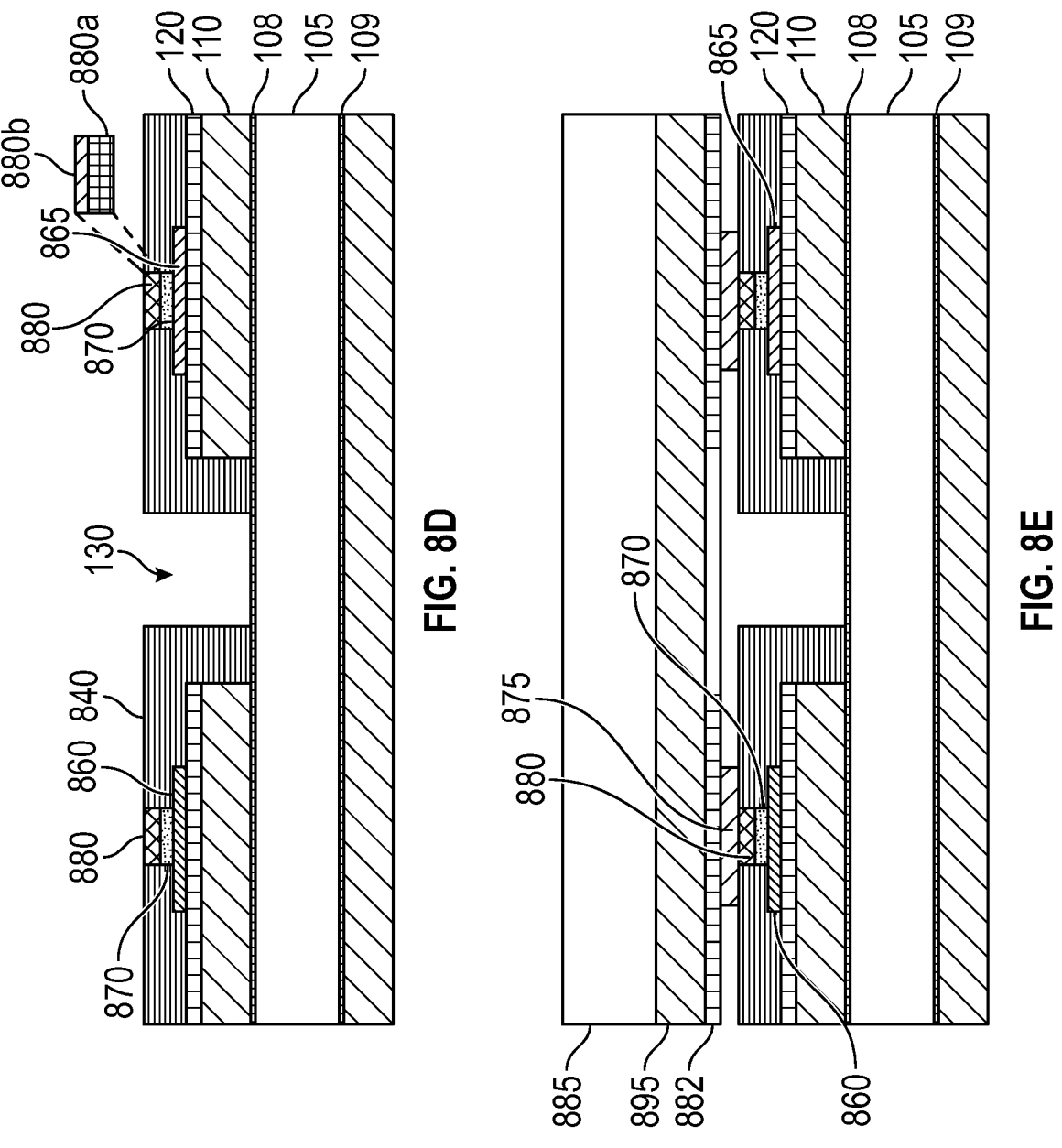
FIG. 8D is a diagram of a cross-section of a thermoelement pair of FIG. 8C after removal of the insulator layers over the metal layers and addition of electroless plating layers according to one embodiment of the present disclosure.
FIG. 8E is a diagram of a cross section of a thermoelectric pair of FIG. 8D after its bonding to an interconnect fabric according to one embodiment of the present disclosure.

FIG. 8D shows a cross-section diagram of FIG. 8C after the etching of the insulator layers 840 to the metal layers 870 and the deposition of electroless plating layers 880 on the metal layers 870. The electroless plating layers 880 are deposited to be flush with the unetched portions of the insulator layers 840. The electroless plating layers 880 may each be made up of two sublayers 880a, 880b. The first sublayer 880a, adjacent to the metal layer 870, is made of electroless nickel or palladium with a thickness of about 1 to about 5 micrometers. The second sublayer 880b, distal to the metal layer 870, is made of electroless (immersion) gold with a thickness of about 100 nanometers to about 3 micrometers.

FIG. 8E shows a cross-section diagram of the FIG. 8D after the addition of bonding layers 875 on the insulator layers 840 and the electroless plating layers 880 and the addition, on the bonding layers 875 of an interconnect fabric 885. The interconnect fabric 885 may be covered by a plated copper layer 895 and an electroless plating layer 882. The bonding layers 875 are between the electroless plating layer 882 on one side and the electroless plating layer 880 and the insulator layers 840 on the other. The electroless plating layer 882 may be made of the same materials and have the same sublayers as the electroless plating layer 880.

FIG. 9 shows a flow chart of a method 900 of making the thermoelement pair 800 based on FIG. 1B. In step 910, a portion of the barrier layer 120 and the first copper layer 110 are removed to form the recess 130. The removal process may include, but is not limited to, laser ablation or etching. In step 920, an n-type thermoelectric material 860 may be deposited on the barrier layer 120 (or energy filter layer 155)

on one side of the recess 130. The thickness of the n-type thermoelectric material 860 may be about 5 micrometers. In some embodiments, the n-type thermoelectric material 860 may include one or more of: Bi—Te—Se, SiGe—P, Mg₃Bi₂, Mg—Sb—B—Te, In—Sb, Bi—Sb, Pb—Se, Sn—S—Se, Half-Heusler alloys, full Heusler alloys, Fe—V—W—Al, Yb—Ba—Co—Sb, La—Te, Pr—Te, SiGe—C, and Yb—Al. In step 930, a p-type thermoelectric material 865 may be deposited on the barrier layer 120 (or the energy filter layer 155) on the other side of the recess 130. The thickness of the p-type thermoelectric material 865 may be about 5 micrometers. In some embodiments, the p-type thermoelectric material 865 may include one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb. In some embodiments, steps 920 and 930 may be performed in reverse order. In step 940, metal layers 870 may be deposited on the thermoelectric materials 860, 865. The metal layers 870 may leave portions of the surface of the thermoelectric materials 860, 865 exposed. The metal layer 870 may be made of sublayers iridium, tantalum nitride, tantalum, silver and gold. The metal layer 870 may have a thickness of about 1 micrometer. In step 950, insulator layers 840 may be deposited on the metal layers 870, the thermoelectric materials 860, 865, and the barrier layers 120. The insulator layers 840 may cover part of first copper layer 110 and the substrate 105. The insulator layers 840 may be made of the same material as the insulator layer 140. In step 960, portions of the insulator layers 840 may be removed to expose the surfaces of the metal layers 870. In step 970, electroless plating layers 880 may be deposited on each of the metal layers 870. The electroless plating layers 880 may each be made up of sublayers 880a, 880b as discussed above. In step 980, an interconnect fabric 885 with at least one side plated with copper 895 and an electroless plating layer 882 is bonded to the electroless plating layers 880 and the insulator layer 840 using a bonding layer 875. The bonding layer 875 may be sintered silver or any other material using in the bonding layers 275, 375.

Figure 10A:
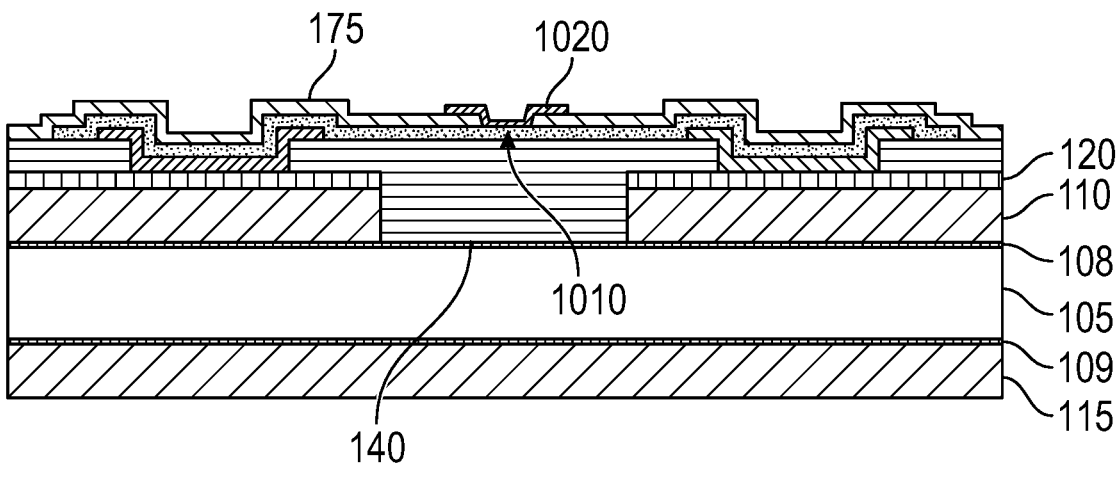
FIG. 10A is a diagram of a cross-section of the overcoated thermoelectric pair of FIG. 1H with metal pad disposed in and adjacent to a gap in the overcoat according to one embodiment of the present disclosure.

FIG. 10A shows a cross-section diagram of the thermo-element pair 100 of FIG. 1H after the removal of portion of the overcoat layer 175 to expose a portion 1010 of the metal layer 170 between the n-type thermoelectric material 160 and the p-type thermoelectric material 165 and the application of a metal pad 1020 on the exposed metal layer 170 and parts of the overcoat layer 175 adjacent to the exposed portion 1010. The metal pad 1020 may be made of 1) TiW/Pt/Au with thicknesses of 100 nanometers/100 nanometers/200 nanometers with the TiW layer proximate to the metal layer 170, Ni/Au with thicknesses of 3 micrometers/ 15 nanometers with the Ni layer proximate to the metal layer 170 or 3) Ni/Pd/Au with thicknesses of 1 micrometer/200 nanometers/50 nanometers with the Ni layer proximate to the metal layer 170.

Figure 10B:
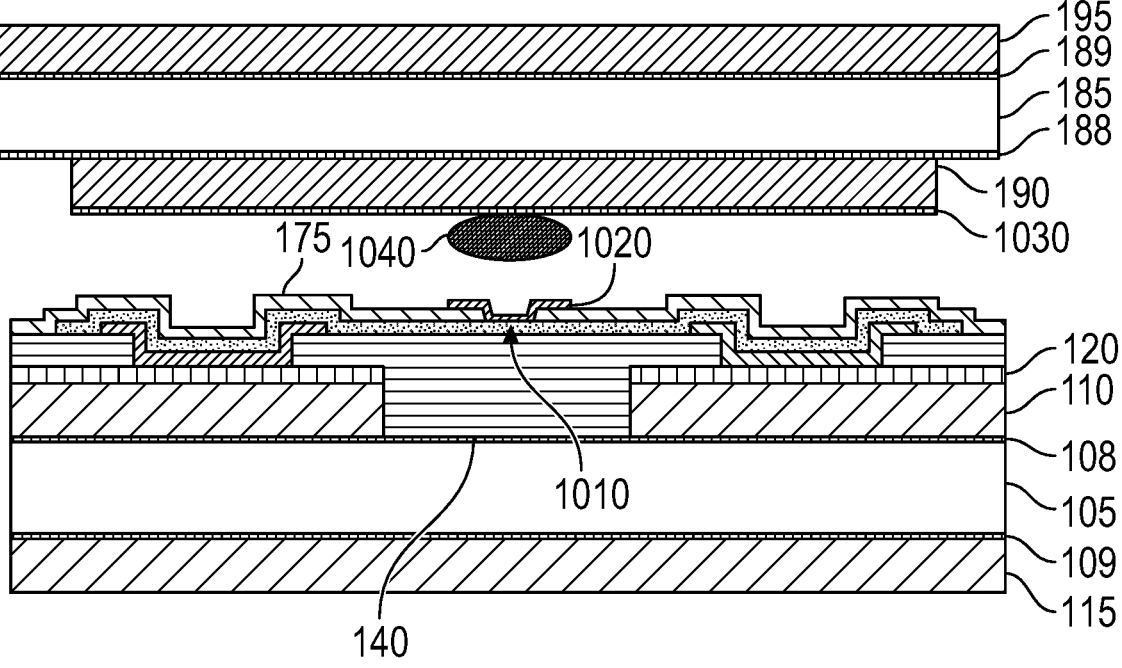
FIG. 10B is a diagram of a cross-section of the thermoelectric pair of FIG. 10A with a second substrate and solder positioned opposite the thermoelectric pair according to one embodiment of the present disclosure.

FIG. 10B shows a cross section diagram of the thermo-element pair 100 of FIG. 10A with a direct bond or elec-troplated copper on silicon layer disposed proximate to it. The direct bond or electroplated copper on silicon may be made up of a silicon layer 185 with its surfaces covered with thin (about 50 nanometer) electrically insulating, thermally conducting layers 188, 189. The layers 188, 189 are made of an electrical insulator and thin enough (around 50 nanometers) to not significantly impede the transmission of heat across the layers. Suitable materials for the electrically insulating, thermally conducting layer include, but are not limited to, silicon dioxide and silicon nitride. The silicon layer 185 is sandwiched between a top copper layer 195 and a bottom copper layer 190. In some embodiments, the top copper layer 195 may be optional. The layers 185, 190, 195 may be selected from the similar material suitable for the layers 105, 110, 115. In some embodiments, the layers 185, 190, 195 may have the same thicknesses as their counter-parts in the layers 105, 110, 115. In some embodiments, the bottom copper layer 190 may be truncated to a width conforming to the highest points of the metal layer 170. The truncation of the bottom copper layer 190 may be performed using laser ablation or etching or other suitable techniques known to a person of skill in the art. A surface layer 1030 may be deposited on the bottom copper layer 190. The surface layer 1030 has the same composition, thickness, and order as the metal pad 1020. Solder 1040 may be disposed on the surface layer 1030 for bonding to the metal pad 1020. As would be understood by person of ordinary skill in the art, the continuity of the metal layer 170 between the thermoelectric materials 160, 165 is optional since electrical continuity is also provided by the bottom copper layer 190. Solder 1040 may be made of a thermally conductive and electrically conductive suitable for the temperatures of operation of the thermoelectric pair 100. The composition of the surface layer 1030 and the solder 1040 may be selected in specific combinations. When the solder 1040 is made of AuSn, the surface layer 1030 may be TiW/Pt/Au, Ni/Au or Ni/Pd/Au. When the solder 1040 is made of Sn—Ag—Cu, the surface layer 1030 may be made of Ni/Au, Ni/Pd/Au, or (optionally) there may be no surface layer 1030, and the solder 1040 may be in direct contact with the bonded copper 190. When the solder 1040 is made of Bi—Sn, the surface layer 1030 may be Ni/Au or Ni/Pd/Au. In all cases where there is a metal pad 1020 and a surface layer 1030, as shown in FIG. 10C, the solder 1040 will be between the metal pad 1020 and the surface layer 1030 and in contact with the Au side of both. For example, if the solder 1040 is AuSn with metal pad 1020 and surface layer 1030 being Ni/Pd/Au, then the Ni sides will be proximate to the metal layer 170 and the bonded copper 190, respectively, and the Au sides will be facing the solder 1040.

FIG. 10C shows a cross-section diagram of the thermo-element pair 100 of FIG. 10B after the solder 1040 has been bonded to the metal pad 1020. The solder 1040 volume may be selected to fill the metal pad 1020 to approximately the same level as the surface layer 1030 resting on the high point of the coating 175.

FIG. 11 shows a flow chart of a method 1100, which continues after step 440 of method 400. In step 1110, a portion 1010 of the overcoat 175 deposited in step 440 is removed to the metal layer 170 from a position between the n-type thermoelectric material 160 and the p-type thermo-electric material 165. In step 1120, a metal pad 1020 is formed on the metal layer 170 in the portion 1010 and adjacent on the overcoat 175. In step 1130, a small amount of solder 1040 is disposed on the surface layer 1030. In step 1140, the solder 1040 and metal pad 1120 are moved relative to one another so that the solder 1040 is flattened into a bonding layer.

While the disclosure has been described with reference to exemplary embodiments, it will be understood that various changes may be made, and equivalents may be substituted for elements thereof, without departing from the scope of the disclosure. In addition, many modifications will be appre-ciated to adapt a particular instrument, situation, or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A thermoelectric apparatus, the apparatus comprising:
a first stage comprising:
  a copper substrate comprising:
    a first copper layer with an opening; and
    a substrate;
    wherein the first copper layer is direct bonded or electroplated onto one face of the substrate;
  a barrier layer disposed on the first copper layer with an opening coterminous with the opening in the first copper layer;
  an insulator disposed on the substrate through the opening in the first copper layer and the opening in the barrier layer and on the barrier layer to form a first insulator gap on one side of the opening in the barrier layer and a second insulator gap on other side of the opening in the barrier layer;
  an n-type thermoelectric layer disposed in the first insulator gap;
  a p-type thermoelectric layer disposed in the second insulator gap;
  a metal layer disposed on the n-type thermoelectric layer, the p-type thermoelectric layer, and on the insulator between the n-type thermoelectric layer and the p-type thermoelectric layer;
  an overcoat layer disposed on the metal layer with a gap disposed between the n-type thermoelement layer and the p-type thermoelement layer;
  a metal pad disposed in the gap and on the overcoat layer;
  a solder layer in contact with the metal pad;
  a surface layer in contact with the solder layer;
  a second copper layer disposed on the surface layer; and
  a second substrate disposed on the second copper layer;
    where the surface layer is made of one of TiW/Pt/Au, Ni/Au, and Ni/Pd/Au; and
      where the solder layer is made of one of Au/Sn, Sn—Ag—Cu, and Bi—Sn.

2. The thermoelectric apparatus of claim 1, further comprising:
  a plurality of energy filter layers disposed between the n-type thermoelectric layer and the barrier layer and between the p-type thermoelectric layer and the barrier layer.

3. The thermoelectric apparatus of claim 2, wherein the plurality of energy filter layers comprises graphene.

4. The thermoelectric apparatus of claim 1, where the substrate is a ceramic that is not electrically conductive and is thermally conductive.

5. The thermoelectric apparatus of claim 1, wherein the barrier layer comprises a plurality of sublayers and at least one of the plurality of sublayers is made up of at least one of: cobalt, iridium, nickel, osmium, palladium, platinum, rhenium, ruthenium, rhodium, and tantalum/tantalum nitride.

6. The thermoelectric apparatus of claim 1, wherein
  the n-type thermoelectric layer is made of one or more of: Bi—Te—Se, SiGe—P, $Mg_3Bi_2$, Mg—Sb—B—Te, In—Sb, Bi—Sb, Pb—Se, Sn—S—Se, Half-Heusler alloys, full Heusler alloys, Fe-V-W-Al, Yb—Ba—Co—Sb, La—Te, Pr—Te, SiGe—C, and Yb—Al; and
  the p-type thermoelectric layer is made of one or more of: Bi—Sb—Te, SiGe—B, Zintl compounds, Yb—Mn—Sb, Ce—Fe—Co—Sb, Ce—Pd, Cs—Bi—Te, Pb—Te, and Zn—Sb.

7. The thermoelectric apparatus of claim 1, where the metal layer is made of a plurality of sublayers and at least one of the plurality of sublayers is made of at least one of aluminum, cobalt, gold, iridium, nickel, osmium, palladium, platinum, rhenium, ruthenium, rhodium, tantalum/tantalum nitride, and titanium tungsten.

8. The thermoelectric apparatus of claim 7, wherein a sublayer of the plurality of sublayers that is distal to the barrier layer is made of at least one of: cobalt, iridium, osmium, palladium, gold, platinum, rhenium, ruthenium, and rhodium.

9. The thermoelectric apparatus of claim 1, further comprising a bonding layer disposed on the metal layer and made of at least one of: sintered silver, AuSn, eutectic solder, metallic ink, and solder.

10. The thermoelectric apparatus of claim 9, further comprising a second direct bond copper substrate disposed on the bonding layer.

11. The thermoelectric apparatus of claim 10 further comprising a second stage identical to the first stage and disposed on the first stage in an inverted position so that complementing thermoelectric n-type and p-type pairs are formed.

* * * * *